United States Patent
Nam et al.

(10) Patent No.: US 8,987,805 B2
(45) Date of Patent: Mar. 24, 2015

(54) VERTICAL TYPE SEMICONDUCTOR DEVICES INCLUDING OXIDATION TARGET LAYERS

(71) Applicants: Phil-Ouk Nam, Hwaseong-si (KR);
Jun-Kyu Yang, Seoul (KR);
Byong-Hyun Jang, Suwon-si (KR);
Ki-Hyun Hwang, Hwaseong-si (KR);
Jae-Young Ahn, Seongnam-si (KR)

(72) Inventors: Phil-Ouk Nam, Hwaseong-si (KR);
Jun-Kyu Yang, Seoul (KR);
Byong-Hyun Jang, Suwon-si (KR);
Ki-Hyun Hwang, Hwaseong-si (KR);
Jae-Young Ahn, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/971,347

(22) Filed: Aug. 20, 2013

(65) Prior Publication Data
US 2014/0054676 A1 Feb. 27, 2014

(30) Foreign Application Priority Data

Aug. 27, 2012 (KR) .................. 10-2012-0093415
Jan. 15, 2013 (KR) .................. 10-2013-0004203

(51) Int. Cl.
*H01L 29/792* (2006.01)
*H01L 27/115* (2006.01)
*H01L 29/788* (2006.01)

(52) U.S. Cl.
CPC ...... *H01L 29/7926* (2013.01); *H01L 27/11519* (2013.01); *H01L 27/11524* (2013.01); *H01L 27/11556* (2013.01); *H01L 27/11565* (2013.01); *H01L 27/1157* (2013.01); *H01L 27/11582* (2013.01); *H01L 29/7889* (2013.01)
USPC .......................................................... 257/324

(58) Field of Classification Search
USPC .................. 257/316–318, 324–326
See application file for complete search history.

(56) References Cited

U.S. PATENT DOCUMENTS

| 8,048,741 | B2 | 11/2011 | Arai et al. |
| 8,344,385 | B2 | 1/2013 | Kim et al. |
| 2009/0278193 | A1 | 11/2009 | Murata et al. |
| 2010/0140685 | A1 | 6/2010 | Kang et al. |
| 2010/0207194 | A1 | 8/2010 | Tanaka et al. |
| 2010/0276743 | A1 | 11/2010 | Kuniya et al. |
| 2011/0233648 | A1 | 9/2011 | Seol et al. |
| 2014/0160841 | A1* | 6/2014 | Koval ................ 365/185.01 |

FOREIGN PATENT DOCUMENTS

| JP | 2007-180389 | 7/2007 |
| KR | 1020090113606 | 11/2009 |
| KR | 1020110034816 | 4/2011 |
| KR | 1020110064551 | 6/2011 |
| KR | 1020110108220 | 10/2011 |

* cited by examiner

*Primary Examiner* — Daniel Shook
(74) *Attorney, Agent, or Firm* — Myers Bigel Sibley & Sajovec, P.A.

(57) ABSTRACT

A vertical type semiconductor device can include a vertical pillar structure that includes a channel pattern with an outer wall. Horizontal insulating structures can be vertically spaced apart from one another along the vertical pillar structure to define first vertical gaps therebetween at first locations away from the outer wall and to define second vertical gaps therebetween at the outer wall, where the second vertical gaps are wider than the first vertical gaps. Horizontal wordline structures can be conformally located in the first and second vertical gaps between the vertically spaced apart horizontal insulating structures, so that the horizontal wordline structures can be vertically thinner across the first vertical gaps than across the second vertical gaps.

19 Claims, 37 Drawing Sheets

VERTICAL TYPE SEMICONDUCTOR DEVICES INCLUDING OXIDATION TARGET LAYERS

CROSS-REFERENCE TO RELATED APPLICATION

This application claims priority under 35 USC §119 to Korean Patent Applications No. 10-2012-0093415 filed on Aug. 27, 2012, and No. 10-2013-0004203, filed on Jan. 15, 2013, in the Korean Intellectual Property Office (KIPO), the entire disclosures of which are incorporated herein by reference.

FIELD

The present invention relates to the field of electronics, and more particularly to vertical type semiconductor devices and methods of forming the same.

BACKGROUND

Techniques of vertically stacking cells with respect to the surface of a substrate have been developed to provide high integration levels for semiconductor devices. The number of vertically stacked cells in semiconductor devices has been increased, and so, when the height of the thin films used in the cells increases, the process may be complicated leading to process defects.

SUMMARY

Example embodiments can provide vertical type semiconductor devices including an increased number of stacked cells.

Example embodiments can provide methods of manufacturing the vertical type semiconductor device.

According to some example embodiments, there is provided a vertical type semiconductor device. The vertical type semiconductor device can include a pillar structure including a semiconductor pattern that protrudes in a first direction and a channel pattern. The first direction can be a vertical direction relative to an upper surface of a substrate. The device can also include first word line structures horizontally extending to surround the pillar structure at a facing portion relative to the channel pattern. The first word line structures can include a blocking dielectric layer pattern and a metal pattern, where a height of the first word line structures can be enlarged at a portion that makes contact with the pillar structure. A first insulating structure can surround the pillar structure between the first word line structures in the first direction also is included. The first insulating structure can include a first portion that is a relatively smaller in height and makes contact with the pillar structure, and a second portion horizontally that can extend to a side direction of the first portion.

In some example embodiments, the first portion of the first insulating structure may include a polysilicon the surface of which is covered with an oxide, or silicon nitride the surface of which is covered with an oxide.

In some example embodiments, the first portion of the first insulating structure may include a thermal oxidation layer pattern.

In some example embodiments, the second portion of the first insulating layer structure may include silicon oxide formed using chemical vapor deposition.

In example embodiments, the vertical type semiconductor device may further include a second word line structure surrounding the pillar structure at a portion facing the semiconductor pattern.

In some example embodiments, the pillar structure may include a first blocking dielectric layer including a tunnel insulating layer, a charge storing layer and silicon oxide stacked one by one to surround an outer wall of the channel pattern.

In some example embodiments, the pillar structure may include a tunnel insulating layer and a charge storing layer stacked one by one to surround an outer wall of the channel pattern.

In some example embodiments, the semiconductor pattern may have a groove shaped side wall portion that makes contact with the second word line structure, and the second word line structure may have a protruding shape at the groove shaped side wall portion and makes contact with the semiconductor pattern.

In some example embodiments, a blocking dielectric layer included in the first word line structure may include a metal oxide.

According to some example embodiments, there is provided a method of manufacturing a vertical type semiconductor device. In the method, a mold layer can be formed by repeatedly stacking sacrificial layers and insulating layers on a substrate. A pillar structure can be formed to penetrate the mold layer and to protrude in a first direction which can be a vertical direction relative to an upper surface of the substrate. The pillar structure includes a semiconductor pattern and a channel pattern. An oxidation target layer can be included at an exterior surface of the pillar structure. Then, the sacrificial layers can be selectively removed to expose the oxidation target layer. A portion of the oxidation target layer can be removed to form oxidation target layer patterns that make contact with the insulating interlayers and having a relatively smaller height than the insulating interlayers in the first direction. The surface of the oxidation target layer patterns can be oxidized to form an oxide to form first insulating layer structures including a first portion having a relatively smaller height and making contact with the pillar structure and the insulating interlayer horizontally extended in the side direction of the first portion. First word line structures can be formed at a gap portion between the first insulating layer structures. The first word line structures can horizontally extended to surround the pillar structure at a portion facing the channel pattern and including a blocking dielectric layer pattern and a metal pattern. A height of the first word line structure at a portion that makes contact with the pillar structure can be enlarged.

In some example embodiments, the oxidation target layer may include polysilicon or silicon nitride.

In some example embodiments, the polysilicon may be at least one selected from the group consisting of undoped polysilicon, p-type polysilicon, n-type polysilicon and carbon doped polysilicon.

In some example embodiments, the oxidation process may include a radical oxidation process or a plasma oxidation process.

In some example embodiments, a portion of the oxidation target layer or a whole of the oxidation target layer may be oxidized while conducting the oxidation process.

In some example embodiments, a portion of an exposed side wall of the semiconductor pattern may be removed to form a groove when removing a portion of the oxidation target layer.

In some example embodiments, the pillar structure may be formed by following method. First, channel holes penetrating the mold layer and exposing a surface of the substrate may be formed. Then, a semiconductor pattern partially filling up a lower portion of the channel holes may be formed. A silicon oxide layer, a first polysilicon layer, a first blocking dielectric layer, a charge storing layer and a tunnel insulating layer may be formed one by one on a side wall of the channel hole. A channel pattern may be formed on the tunnel insulating layer and the semiconductor pattern. Then, an insulating pattern may be formed on the channel pattern for filling up the channel hole.

In some example embodiments, the first blocking dielectric layer may include silicon oxide.

In some example embodiments, the pillar structure may be formed by following method. First, channel holes penetrating the mold layer and exposing a surface of the substrate may be formed. Then, a semiconductor pattern partially filling up a lower portion of the channel holes may be formed. A silicon oxide layer, a first polysilicon layer, a charge storing layer and a tunnel insulating layer may be formed one by one on a side wall of the channel hole. A channel pattern may be formed on the tunnel insulating layer and the semiconductor pattern. Then, an insulating pattern may be formed on the channel pattern for filling up the channel hole.

In some example embodiments, a vertical type semiconductor device can include a vertical pillar structure that includes a channel pattern with an outer wall. Horizontal insulating structures can be vertically spaced apart from one another along the vertical pillar structure to define first vertical gaps therebetween at first locations away from the outer wall and to define second vertical gaps therebetween at the outer wall, where the second vertical gaps are wider than the first vertical gaps. Horizontal wordline structures can be conformally located in the first and second vertical gaps between the vertically spaced apart horizontal insulating structures, so that the horizontal wordline structures can be vertically thinner across the first vertical gaps than across the second vertical gaps.

As described above, a vertical type semiconductor device manufactured in exemplary embodiments may have decreased vertical height of cells formed in each layer. Thus, the number of stacking of the vertical type semiconductor device may be increased.

BRIEF DESCRIPTION OF THE DRAWINGS

FIGS. 4A to 4J are cross-sectional views illustrating methods of forming the vertical type semiconductor device illustrated in FIGS. 1 to 3;

DETAILED DESCRIPTION OF THE EMBODIMENTS

Figure 1:
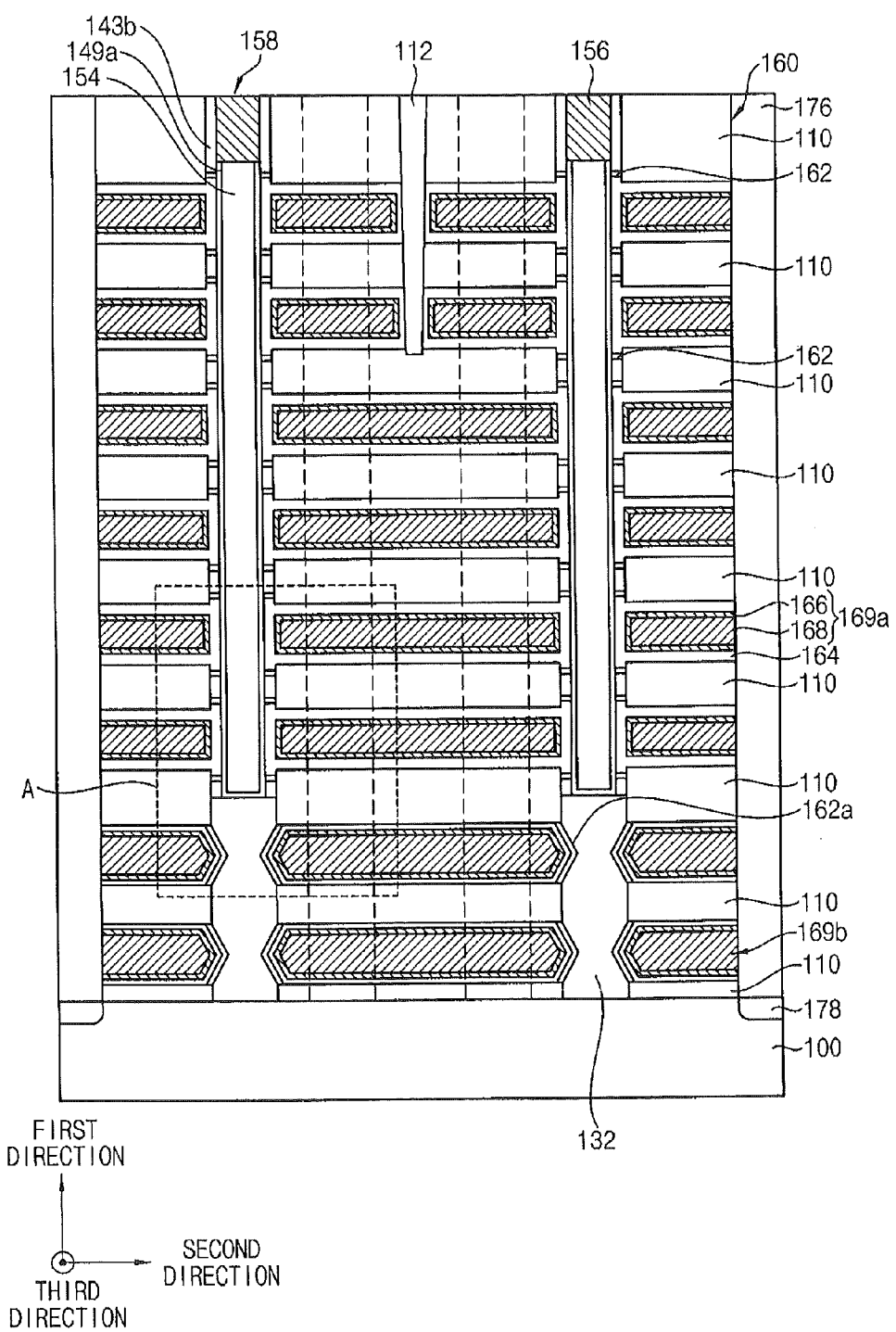
FIG. 1 is a cross-sectional view illustrating a vertical type semiconductor device in accordance with some embodiments of the present inventive concept.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
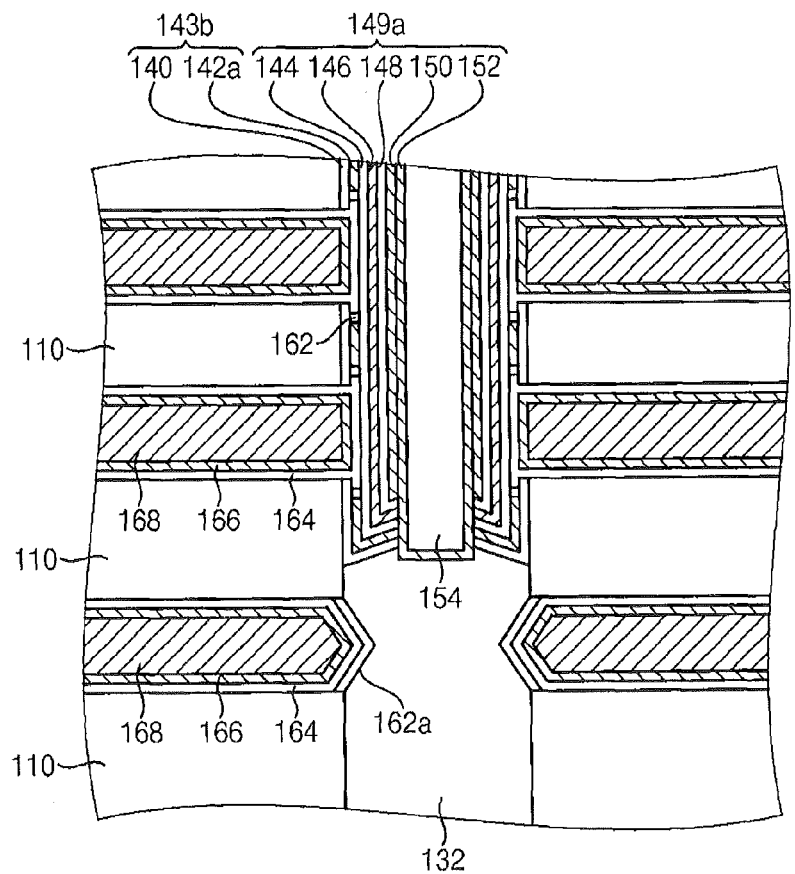
FIG. 2 is an enlarged view of section A in FIG. 1.
Figure 3:
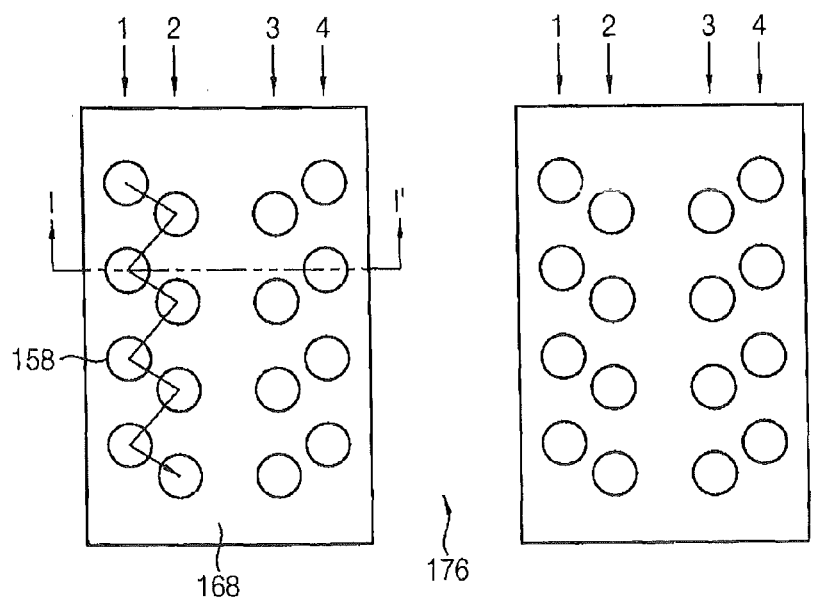
FIG. 3 is a plan view of the vertical type semiconductor device in FIG. 1.

FIG. 1 is a cross-sectional view illustrating a vertical type semiconductor device in accordance with some embodiments of the present inventive concept. FIG. 2 is an enlarged view of section A in FIG. 1. FIG. 3 is a plan view of the vertical type semiconductor device in FIG. 1. FIGS. 1 and 2 are cross-sectional views taken along a line I-I' in FIG. 3.

Hereinafter, the vertical direction with respect to the upper surface of a substrate may be defined as a first direction, the direction in parallel with the upper surface of the substrate and vertical with respect to the extended direction of a word line may be defined as a second direction, and an extended direction of the word line may be defined as a third direction.

Referring to FIGS. 1 to 3, a vertical type memory device may include a semiconductor pattern 132 extended in the first direction on a substrate 100 and a pillar structure 158 including channel patterns 150 and 152 having a cylinder shape and extruded and extended in the first direction, a first buried insulating layer pattern 154 filling up the inner space of the channel patterns 150 and 152, and a tunnel insulating layer 148, a charge storing layer 146 and a first blocking dielectric layer 144 stacked to surround the outer wall of each of the channel patterns 150 and 152 on the semiconductor pattern 132. The vertical type memory device may include first and second word line structures 169a and 169b surrounding the side wall of the pillar structure 158 and extended in the third direction. Some of the pillar structures 158 may be provided with the first and second word line structures 169a and 169b having a stacked structure while being spaced apart in the first direction. Between the first and second word line structures 169a and 169b vertically spaced apart, first insulating layer structures 110, 143b and 162 may be provided. In addition, the vertical type memory device may further include a common source line (CSL) 178 and a bit line.

In FIG. 1, the channel patterns 150 and 152, the tunnel insulating layer 148, the charge storing layer 146 and the first blocking dielectric layer 144 are illustrated as one layer 149a. However, the layers may have a stacked structure as illustrated in FIG. 2.

The substrate 100 may include, for example, a semiconductor material such as silicon and germanium.

The semiconductor pattern 132 may make contact with the surface of the substrate 100 and have a pillar shape extruded from the surface of the substrate 100. The semiconductor pattern 132 may include single crystalline silicon doped or undoped with impurities. The portion of the semiconductor pattern 132 contacting the second word line structure 169b may include grooves in the side wall. That is, the side wall portion of the semiconductor pattern 132 making contact with the second word line structure 169b may have a narrower width in the second direction.

The channel patterns 150 and 152 may have a cylinder shape and may make contact with the upper surface of the semiconductor pattern 132. As described above, the first burying insulating layer pattern 154 may fill up the inner space of the cylinder shaped channel patterns 150 and 152. Alternatively, the channel patterns 150 and 152 may have a cyclic pillar shape. The channel patterns 150 and 152 may include polysilicon or single crystalline silicon doped or undoped with impurities.

The tunnel insulating layer 148 may have a shape surrounding the outer wall of the channel patterns 150 and 152. The tunnel insulating layer 148 may include an oxide such as silicon oxide.

The charge storing layer 146 may be provided on the tunnel insulating layer 148 and may include a nitride such as silicon nitride.

On the pillar structure 158, a pad 156 may be provided. The pad 156 may include polysilicon or single crystalline silicon doped or undoped with impurities. The pad 156 may be electrically connected with the channel patterns 150 and 152.

The pillar structures 158 may be formed in the second and third directions. In this case, a channel array may be defined. Particularly, the channel array may include a first channel row 1 including the pillar structures disposed in a first row in the third direction, and a second channel row 2 including the pillar structures disposed in a second row in the third direction (see FIG. 3). In this case, the pillar structures 158 included in the first channel row 1 and the second channel row 2 may not be disposed in parallel to each other with respect to the second direction. Accordingly, the pillar structures 158 included in the first and second rows 1 and 2 may be disposed in a zigzag type pattern in the third direction as shown in FIG. 3.

Adjacent to the first channel row 1 and the second channel row 2, third and fourth channel rows 3 and 4 may be provided. The third and fourth channel rows 3 and 4 may be provided symmetrically to the first and second channel rows 1 and 2, respectively, with an imaginary face adjacent to the second row and defined by the first and third directions as a reference face. That is, the pillar structures included in the third channel row 3 may be disposed in parallel to the pillar structures included in the second channel row 2 in the second direction.

In addition, the pillar structures 158 included in the fourth channel row 4 may be disposed in parallel to the pillar structures 158 included in the first channel row 1 in the second direction.

The first to fourth channel rows 1, 2, 3 and 4 may constitute one channel set. The channel set may be disposed repeatedly. Between the channel sets, an insulating material 176 may be provided.

The first word line structures 169a may be disposed facing the channel patterns 150 and 152. The first word line structures 169a may have a shape that fills up a gap portion between the first insulating layer structures 110, 143b and 162 in each layer in the first direction. The external shape of the first word line structures 169a may be an extended line shape while surrounding the channel sets.

The first word line structure 169a may include a second blocking dielectric layer 164, a barrier metal layer 166 and a metal layer 168. These layers may have a stacked structure. The second blocking dielectric layer 164 and the barrier metal layer 166 may be formed along the surface of the first insulating layer structures 110, 143b and 162 in upper and lower layers and the side wall profile of the pillar structure 158. Therefore, the second blocking dielectric layer 164 and the barrier metal layer 166 may have a cylinder shape having the side surface of the pillar structure as a bottom. The metal layer 168 may have a shape filling up a gap between the first insulating structures 110, 143b and 162 on the barrier metal layer 166.

The second blocking dielectric layer 164 may include a metal oxide having a higher electric constant than silicon nitride. Particularly, the second blocking dielectric layer 164 may include a metal oxide. Examples of the metal oxide used for the second blocking dielectric layer may include aluminum oxide, hafnium oxide, lanthanum oxide, lanthanum aluminum oxide, lanthanum hafnium oxide, hafnium aluminum oxide, titanium oxide, tantalum oxide, zirconium oxide, etc.

The barrier metal layer 166 and the metal layer 168 may provide a control gate of each cell transistor. The control gate may be extended in the third direction and may function as a word line. The barrier metal layer 166 may include a conductive metal nitride, for example, titanium nitride and tantalum nitride. The metal layer 168 may include a metal having a low electric resistance. Examples of the metal used for the metal layer may include tungsten, titanium, platinum, etc. In this example embodiment, the metal layer 168 may include tungsten.

Referring to the cross-sectional view illustrated in FIG. 2, the first word line structure 169a in each layer may have an extruding (i.e., protruding) shape from the side wall surface of the pillar structure 158 in the side direction.

The height in the first direction of the first word line structure 169a making contact with the side wall of the pillar structure 158 in each layer may be relatively greater than other portions of the first word line structure 169a. When the contacting portion of the first word line structure 169a with the side wall of the pillar structure is defined as a lower portion, the lower portion of the first word line structure 169a may have an enlarged shape in the first direction compared to the upper portion thereof. Since the contacting portion of the first insulating layer structures 110, 143b and 162 with the side wall of the pillar structure 158 may have a relatively smaller height compared with other portions of the first insulating layer structures 110, 143b and 162, the gap at the contacting portion with the side wall of the pillar structure 158 may be relatively increased.

As illustrated in FIG. 2, the second blocking dielectric layer 164 included in the first word line structure 169a may extend upward and downward at the contacting portion with the side wall of the pillar structure 158. Since the second blocking dielectric layer 164 may fill up most of the enlarged gap portion, the barrier metal layer 166 and the metal layer 168 may hardly have a portion that extends upward and downward (in the first direction). Accordingly, the property change of a cell transistor due to the extending portion may be reduced.

The first insulating layer structures 110, 143b and 162 of each layer may include a first portion making contact with the side wall of the pillar structure and a second portion at the side portion of the first portion. As described above, the first directional height of the first portion may be smaller than the first directional height of the second portion.

The first portion of the first insulating layer structure 110, 143b and 162 may have a structure including an oxidation target layer pattern and an oxide layer covering the surface of the oxidation target layer pattern. The oxidation target layer pattern may include a material for forming an oxide having an insulating property through an oxidation process. The oxide layer covering the oxidation target layer pattern may be an oxidized product obtained from the material forming the oxidation target layer. Particularly, the oxidation target layer pattern may include polysilicon or silicon nitride. In addition, the oxide may be silicon oxide.

Hereinafter, exemplary embodiments will be explained when using a polysilicon pattern as the oxidation target layer pattern and when using a silicon oxide layer as the oxide layer. In another embodiment, silicon nitride may be used as the oxidation target layer instead of polysilicon. The same procedure will be conducted when the silicon nitride is used as the oxidation target layer.

A structure including a polysilicon pattern 142a and silicon oxide layers 140 and 162 covering the surface of the polysilicon pattern 142a may be provided. The silicon oxide layer 162 making direct contact with the upper and lower surface of the polysilicon pattern 142a may be a thermal oxide layer formed through a thermal oxidation of the surface of the polysilicon pattern 142a.

The second portion may include first insulating interlayers 110 comprising silicon oxide. The first insulating interlayers 110 may be silicon oxide formed through a chemical vapor deposition process.

In exemplary embodiments, at the contacting portion of the first insulating layer structures 110, 143b and 162 with the pillar structure, a polysilicon pattern 142a may be included. The surface of the polysilicon pattern 142a may be surrounded by the silicon oxide layer and may be insulated. Since the first portion of the first insulating layer structures 110, 143b and 162 is lower than the second portion, the gap portion between the first portions may be relatively large. Thus, the width of the lower portion of the first word line structure may be enlarged in the first direction.

The gate electrode at the first floor or at the second floor formed on the pillar structure among the first word line structures 169a may be provided as a string selection line (SSL).

The second word line structure 169b may be disposed so as to face the semiconductor pattern 132 portion. The second word line structure 169b may be provided as a ground selection line (GSL).

The second word line structure 169b may be formed at the side wall portion of the semiconductor pattern 132 including a groove. The second word line structure 169b may include a silicon oxide layer 162a, a second blocking dielectric layer 164, a barrier metal layer 166 and a metal layer 168, and these layers may have a stacked structure. The silicon oxide layer 162a may include a thermal oxide layer. The second blocking dielectric layer 164, the barrier metal layer 166 and the metal layer 168 may be formed by using the same material as the first word line structure 169a and may have the same stacked structure.

Different from the first word line structure 169a, the height of the second word line structure 169b at the contacting portion with the semiconductor pattern 132 may not be enlarged. The sidewall of the second word line structure 169b making contact with the semiconductor pattern 132 may not be vertical but may have a slope along upward and downward and steeply extruded laterally.

Since the width of the semiconductor pattern 132 at the portion making contact with the second word line structure 169b decreases, distances between neighboring semiconductor patterns 132 may be increased even further. Thus, electrical interference between neighboring semiconductor devices formed on semiconductor patterns 132 may be decreased.

Figure 10A:
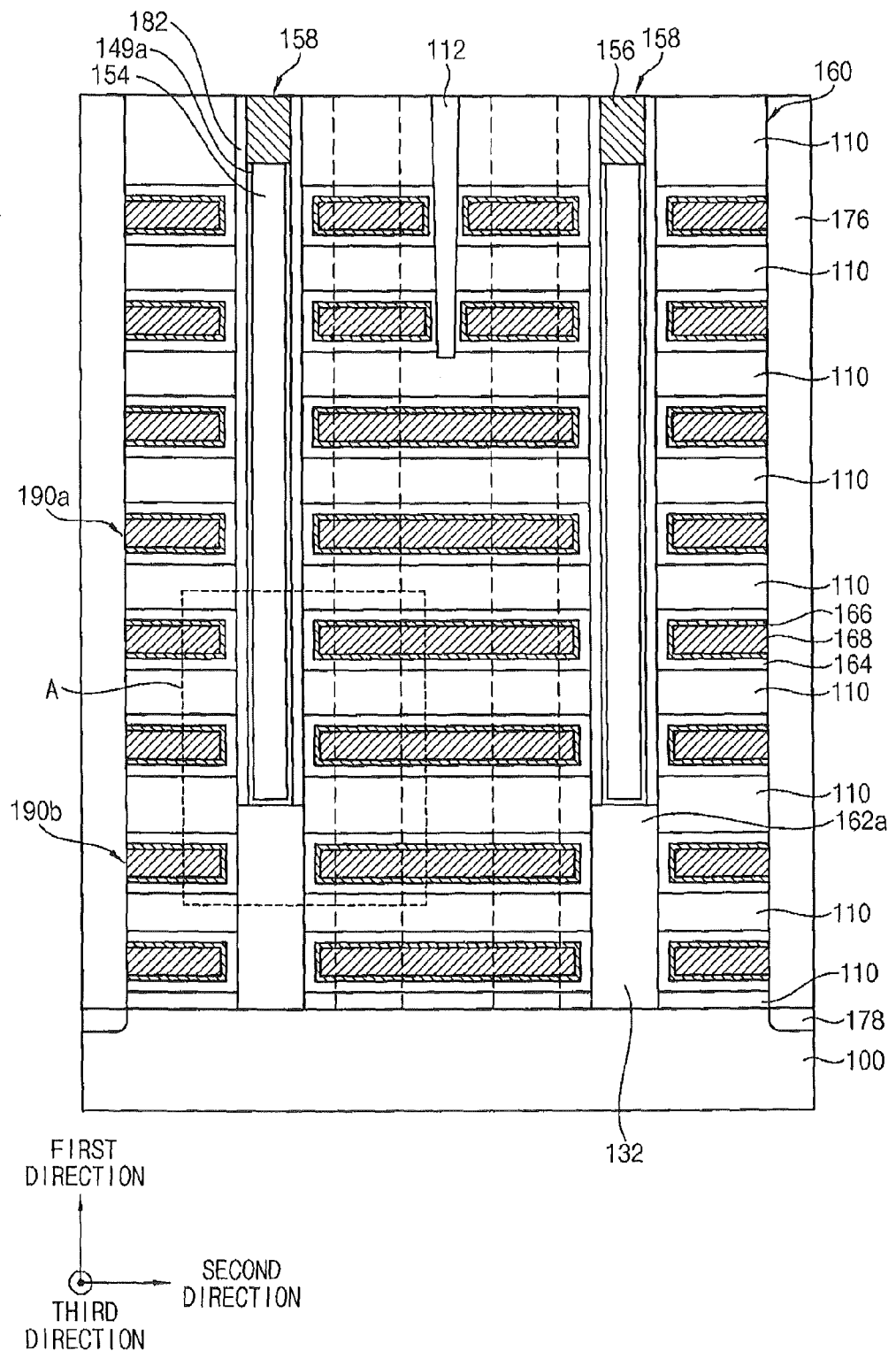
FIG. 10A is a cross-sectional view of a vertical type semiconductor device in accordance with some embodiments of the present inventive concept.

Alternatively, when silicon nitride is used as the oxidation target layer pattern, the width of the semiconductor pattern may be constant. In this case, the semiconductor pattern portion may have the shape as illustrated in FIG. 10A.

The first and second word line structures 169a and 169b and the first insulating layer structures may be stacked in the first direction, and the stacked structures may be extended in the third direction. Therefore, between the stacked structures, an opening portion 160 having a trench shape for separating the stacked structures may be provided. The inner portion of the opening portion 160 may be filled up with a second burying insulating layer pattern 176.

On the substrate 100 under the second burying insulating layer pattern 176, an impurity region 178 extended in the third direction and performing the function of a common source line (CSL) may be formed. In exemplary embodiments, the impurity region 105 may include n-type impurities such as phosphor, arsenic, etc. On the impurity region 178, a metal silicide pattern, for example, a cobalt silicide pattern and a nickel silicide pattern may be further formed even though not illustrated.

The bit line may make an electric connection with the pad 156 by a bit line contact. Thus, the bit line and the channel patterns 150 and 152 may make an electric connection. The bit line may include a metal, a metal nitride, a doped polysilicon, etc.

FIGS. 4A to 4J are cross-sectional views illustrating methods of forming the vertical type semiconductor device illustrated in FIGS. 1 to 3. FIGS. 5A to 5F are enlarged views of a portion of each cross-sectional view among FIGS. 4A to 4J.

Figure 4A:
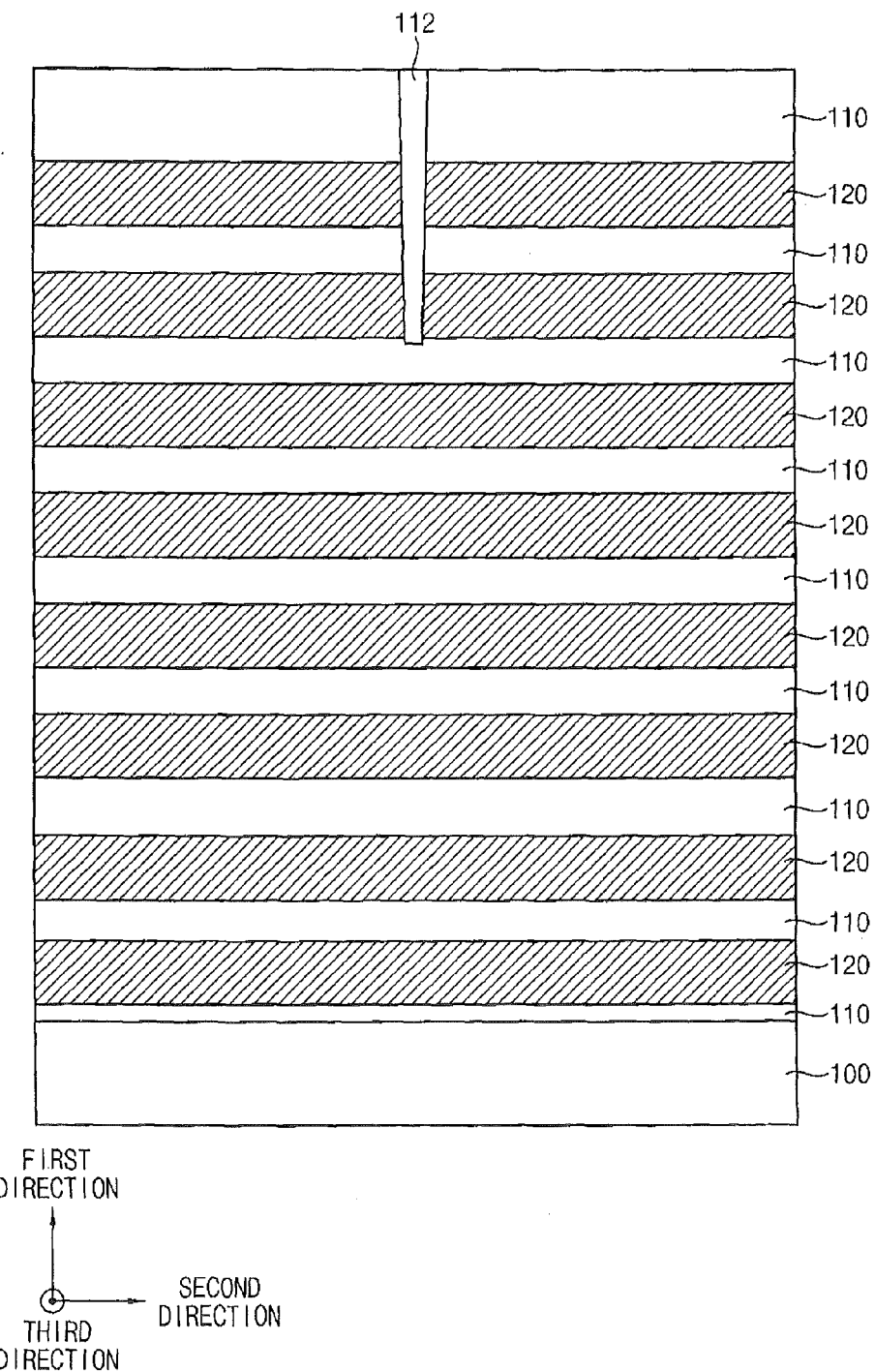

Referring to FIG. 4A, first insulating interlayers 110 and sacrificial layers 120 may be alternately and repeatedly stacked on a substrate 100. Thus, a plurality of the first insulating interlayers 110 and a plurality of the sacrificial layers 120 may be alternately stacked in the first direction. The substrate 100 may include a semiconductor material such as silicon, germanium, etc.

The first insulating interlayers 110 and the sacrificial layers 120 may be formed by a chemical vapor deposition (CVD) process, a plasma enhanced chemical vapor deposition (PECVD) process, an atomic layer deposition (ALD) process, etc. The first insulating interlayers 110 may comprise silicon oxide and the sacrificial layers 120 may comprise a material having an etching selectivity with respect to the first insulating interlayer 110 such as silicon nitride.

Through the processes described herein, a gate of each transistor may be formed at portions of the sacrificial layers in each layer. Accordingly, the number of the stacking of the first insulating interlayer and the sacrificial layers may be increased or decreased according to the number of the transistors stacked in the first direction.

A trench penetrating one or two upper layers of the first insulating interlayers and the sacrificial layers 120 among the first insulating interlayers 110 and the sacrificial layers 120 may be formed, and an isolation layer pattern 112 filling the trench may be formed. The isolation layer pattern 112 may be formed to separate subsequently formed SSLs. Thus, the isolation layer pattern 112 may penetrate the sacrificial layers, which provide a mold for forming the SSL.

Figure 4B:
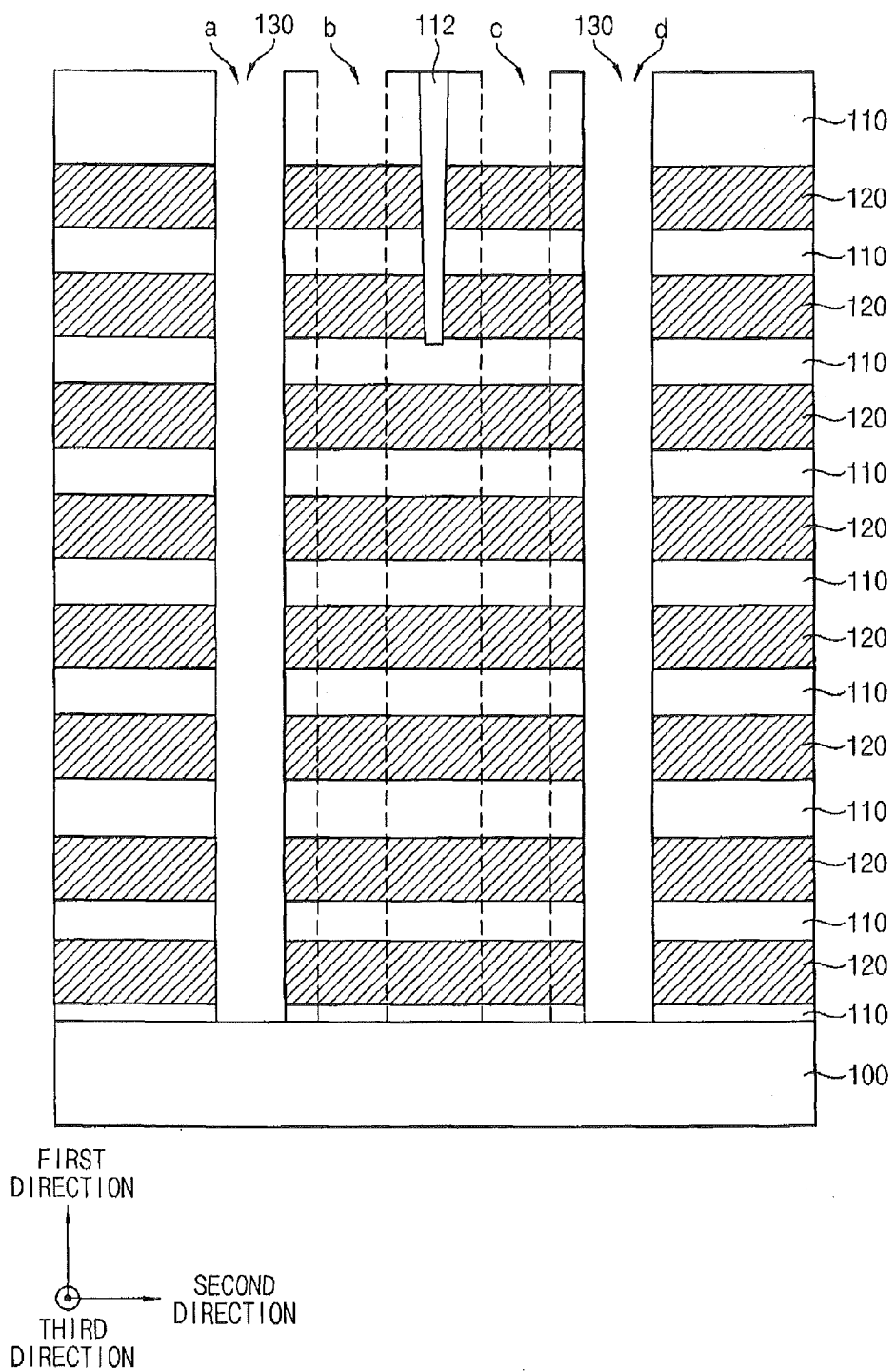

Referring to FIG. 4B, a plurality of channel holes 130 are formed to expose the upper surface of the substrate 100 by penetrating the first insulating interlayers 110 and the sacrificial layers 120.

The channel holes 130 may be formed by forming a hard mask on the uppermost insulating interlayer 110 and conducting a dry etching process using the hard mask as an etching mask. Due to the characteristic of the dry etching process, the width of each of the channel holes 130 may gradually become narrower with the depth of the holes 130.

A plurality of the channel holes 130 may also be formed in the second and third directions. Thus, an array of channel holes may be defined. The hole array may be disposed in the same manner as the above-described channel arrays.

Referring to the channel array in FIG. 3 along with FIG. 4B, first holes a formed along the third direction and disposed in the first row 1, and second holes b formed along the third direction and disposed in the second row 2 may be formed. The first holes a may be nonparallel to the second holes b in the second direction, but may be disposed in a zigzag type (or pattern as shown). In addition, third holes c disposed in the third row 3 separated from the first and second rows 1 and 2, and fourth holes d disposed in the fourth row 3 may be formed. The third holes c and the fourth holes d may be disposed symmetrically to the first and second holes a and b included in the first and second rows with reference to an imaginary face defined by the first and third directions as a reference face.

In the cross-sectional view in FIG. 4b, only the holes a and d disposed in the first and fourth rows 1 and 4 may be illustrated. Thus, the second and third holes b and c disposed in the second and third rows 2 and 3 may be illustrated in dotted lines.

Figure 4C:
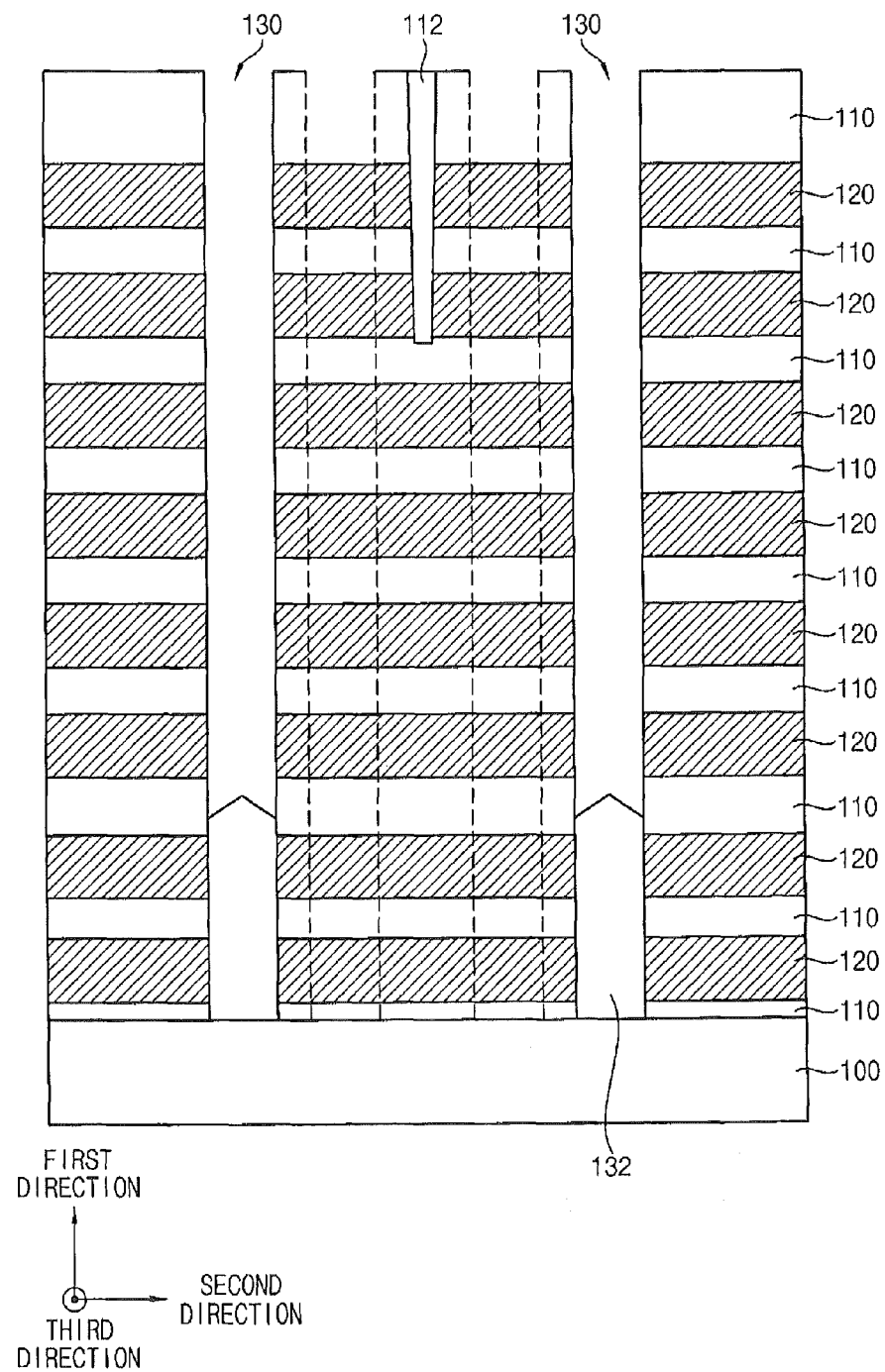

Referring to FIG. 4C, a semiconductor pattern 132 partially filling up the lower portion of each of the channel holes 130 may be formed.

Particularly, the semiconductor pattern 132 partially filling up the lower portion of the channel holes 130 may be formed by conducting a selective epitaxial growth (SEG) process using the upper surface of the exposed substrate 100 by the channel holes 130 as a seed. The semiconductor pattern 132 may be formed to include single crystalline silicon or single crystalline germanium, and may be doped or undoped with impurities. The semiconductor pattern 132 may be provided as a channel layer of a ground select transistor. Thus, the semiconductor pattern 132 may be formed to have an upper surface higher than the upper surface of the sacrificial layer 120 in a layer for forming GSL.

Hereinafter, exemplary embodiments will be described referring to the enlarged views in FIGS. 5A to 5F on section A in FIG. 1 together.

Figure 4D:
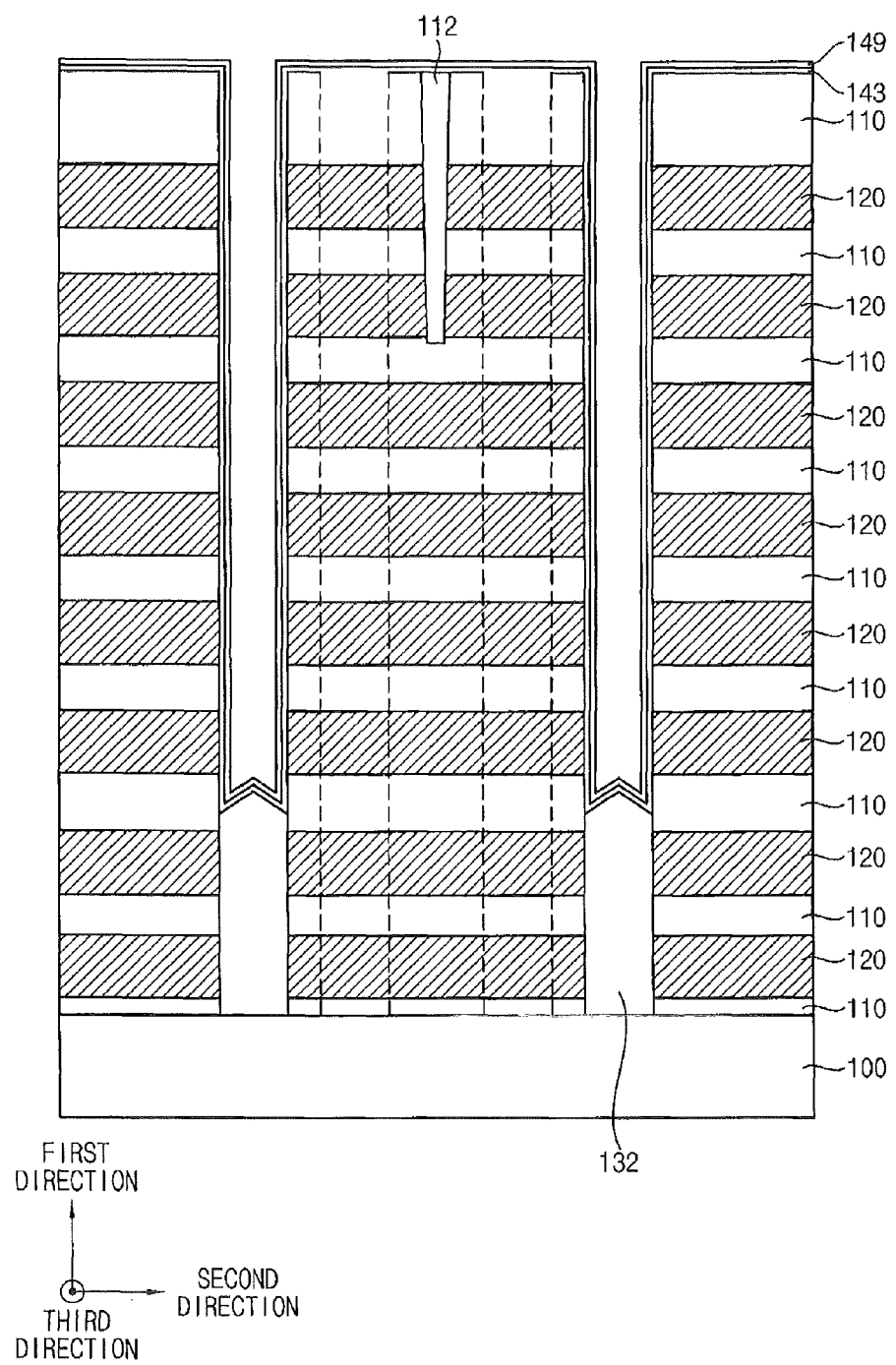
Figure 5A:
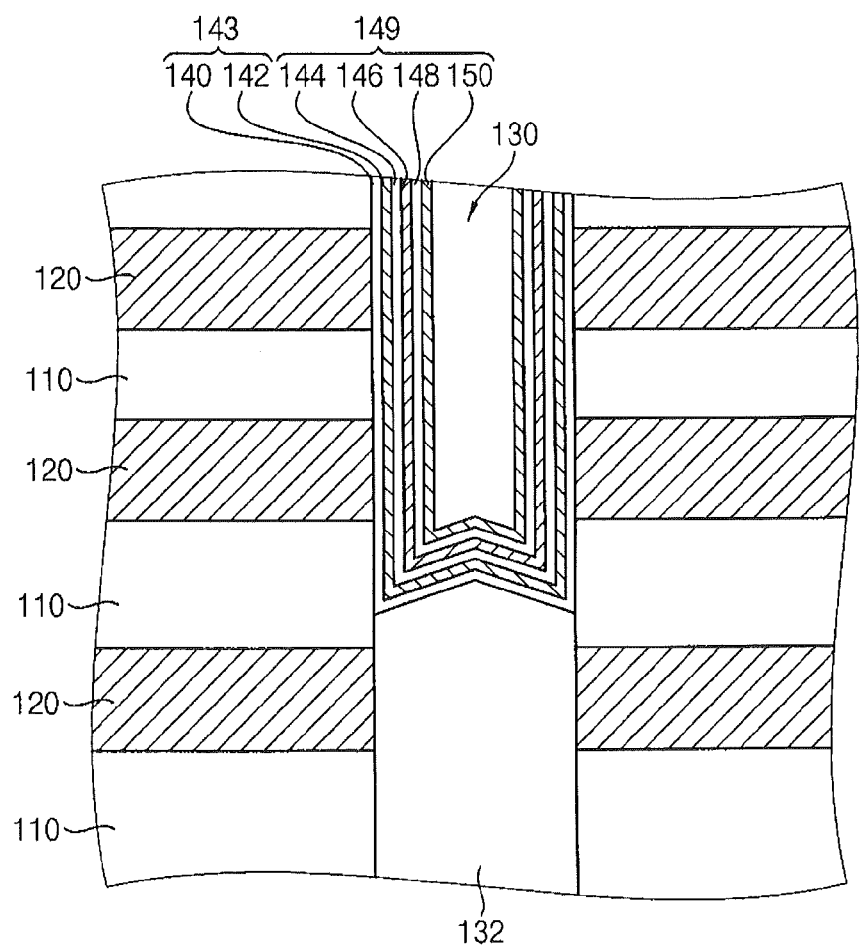
FIGS. 5A to 5F are enlarged views of a portion of each cross-sectional view among FIGS. 4A to 4J.

Referring to FIGS. 4D and 5A, on the inner wall of the channel holes 130, on the upper surface of the semiconductor pattern 132 and on the upper surface of the hard mask, a first silicon oxide layer 140, an oxidation target layer 142, a first blocking dielectric layer 144, a charge storing layer 146, a tunnel insulating layer 148 and a polysilicon layer 150 may be formed one by one.

The oxidation target layer 142 may include a material for forming an oxide having an insulating property through an oxidation process. Particularly, the oxidation target layer 142 may include polysilicon or silicon nitride. In exemplary embodiments, the oxidation target layer 142 may comprise polysilicon. However, the oxidation target layer 142 may comprise silicon nitride. In this case, the subsequent processes may be conducted by the same manner. Hereinafter, the oxidation target layer 142 may be called as a first polysilicon layer and the polysilicon layer 150 may be called a second polysilicon layer.

Silicon oxide and silicon nitride may be further formed on the second polysilicon layer 150. The silicon oxide and the silicon nitride may be formed to passivate the second polysilicon layer 150. The thin layers may be formed along the inner surface profile of the channel holes 130 and may not completely fill up the channel holes 130. That is, an inner space may remain in the channel holes 130 after forming the thin layers.

Referring to FIG. 4D, the first silicon oxide layer 140 and the first polysilicon layer 142 may be collectively referred to as a first layer 143, which may be one layer, and the first blocking dielectric layer 144, the charge storing layer 146, the tunnel insulating layer 148 and the second polysilicon layer 150 may be collectively referred to as a second layer 149, which may be another one layer.

The first silicon oxide layer 140 may be a buffer layer for improving the adhesion property of the first polysilicon layer. The first silicon oxide layer 140 may be formed to have a thin thickness of a few A so as to be easily removed while conducting a removing process of the sacrificial layer in a following process.

The first polysilicon layer 142 may function as an etch stopping layer when removing the sacrificial layer 120. The first polysilicon layer 142 may be etched more slowly than silicon oxide formed by a chemical vapor deposition process when removing the sacrificial layer 120. Since the first polysilicon layer 142 may be etched less when removing the sacrificial layer 120, the first polysilicon layer 142 may remain almost the same thickness as deposited. In addition, the first polysilicon layer 142 may be transformed into an insulating material through an oxidation process. Thus, the first polysilicon layer 142 may be appropriately used as the etch stopping layer while removing the sacrificial layer 120. Examples of polysilicon used as the first polysilicon layer 142 may include undoped polysilicon, p-type polysilicon, n-type polysilicon, carbon doped polysilicon, etc.

In an alternative embodiment, a silicon nitride layer may be formed as the oxidation target layer instead of the first polysilicon. In this case, the first silicon oxide layer 140 may function as the etch stopping layer for removing the sacrificial layer 120.

The first blocking dielectric layer 144 may be silicon oxide formed through a chemical vapor deposition process. The first blocking dielectric layer 144 may not function as a vertical blocking sacrificial layer for preventing damage of the pillar structure previously formed while conducting a subsequent process, but may be used as a dielectric layer.

The charge storing layer 146 may comprise a nitride such as silicon nitride. The tunnel insulating layer 148 may comprise an oxide such as silicon oxide.

The second polysilicon layer 150 may be provided as a portion of a channel pattern in a subsequent process. The second polysilicon layer 150 may be doped or undoped with impurities.

Figure 4E:
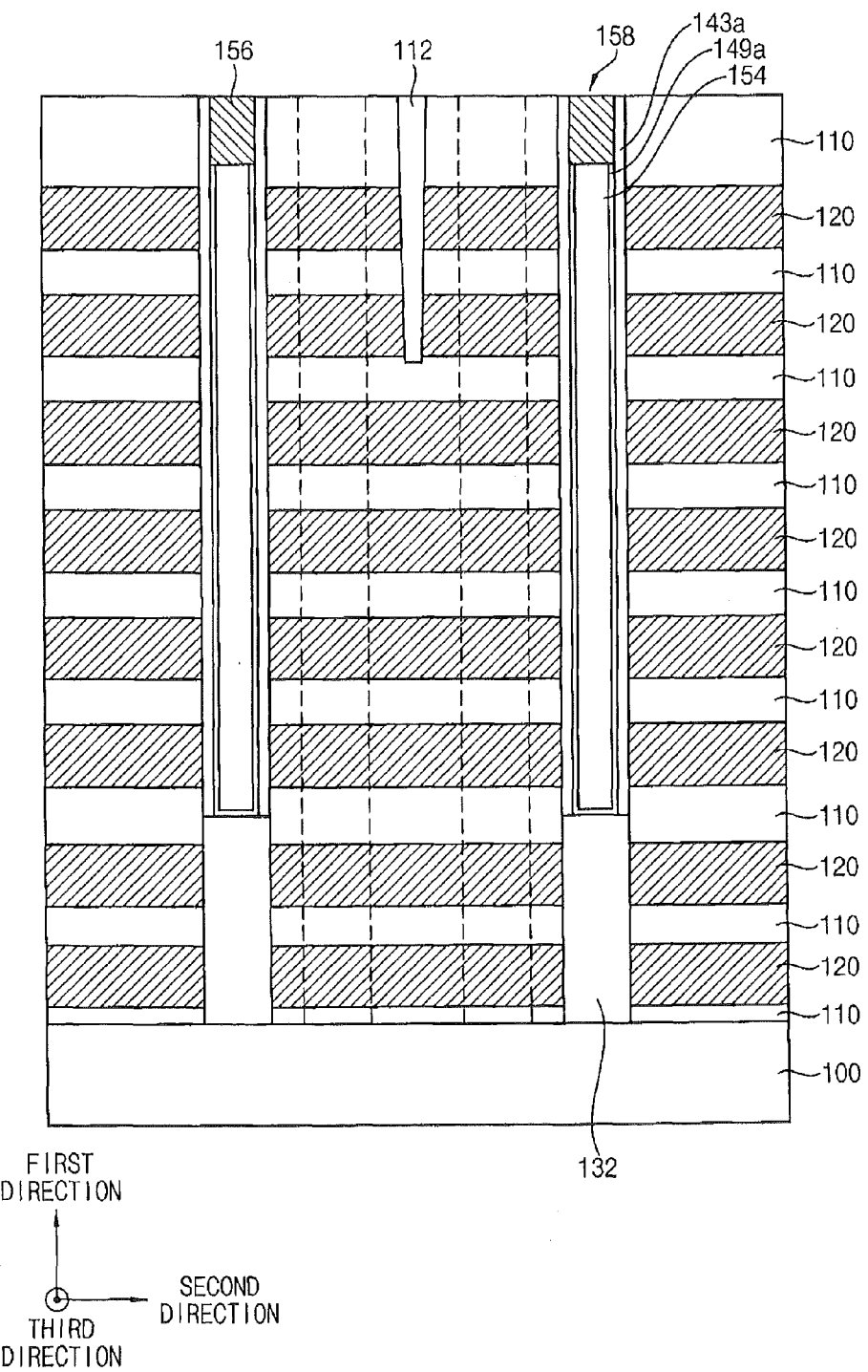
Figure 5B:
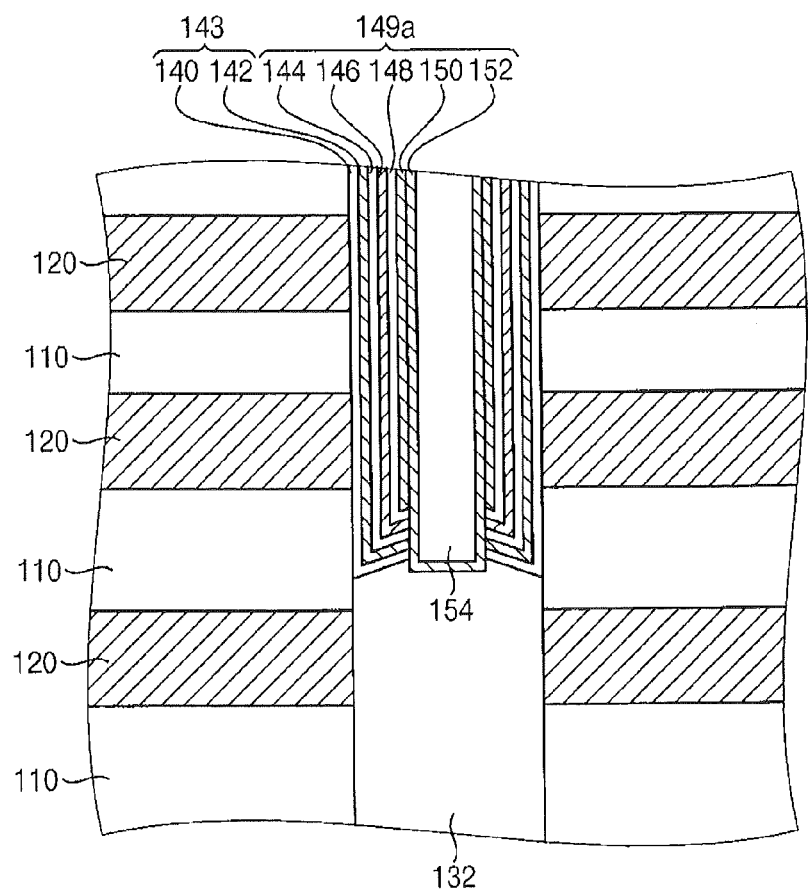

Referring to FIGS. 4E and 5B, the bottom portion of the second polysilicon layer 150, the tunnel insulating layer 148, the charge storing layer 146, the first blocking dielectric layer 144, the first polysilicon layer 142 and the first silicon oxide layer 140 may be etched to expose the upper portion of the semiconductor pattern 132.

A second polysilicon layer 150, a tunnel insulating layer 148, a charge storing layer 146, a first blocking dielectric layer 144, a first polysilicon layer 142 and a first silicon oxide layer 140 may remain on the side wall of the channel hole 130 as a spacer shape after etching.

When the silicon oxide and the silicon nitride are formed on the second polysilicon layer 150 in a previous process, the silicon oxide and the silicon nitride may be removed together while conducting the etching process.

On the surface of the second polysilicon layer 150 and the semiconductor pattern 132, a third polysilicon layer 152 may be formed. The second and third polysilicon layers 150 and 152 may be provided as channel patterns. The channel patterns 150 and 152 may make contact with the semiconductor pattern and may have a cylinder shape.

In FIGS. 4E to 4I, the first silicon oxide layer 140 and the first polysilicon layer 142 having the spacer shape are illustrated as a first layer 143*a* of one layer, and the first blocking dielectric layer 144, the charge storing layer 146, the tunnel insulating layer 148, and the second and third polysilicon layers 150 and 152 are illustrated as a second layer 149*a* of another one layer.

An insulating layer is formed to completely fill up the inner portion of the channel holes 130, and a first burying insulating layer pattern 154 may be formed by polishing the insulating layer. The first burying insulating layer pattern 154 may include silicon oxide.

Subsequently, a portion of the upper portion of the first burying insulating layer pattern 154 may be removed to form openings. In the openings, a polysilicon layer may be formed and polished to form a pad 156.

Through conducting the processes, pillar structures 158 may be formed in the channel holes 130. As described referring to FIG. 3, the pillar structures 158 may include each of the channel sets including the first to fourth channel rows.

Figure 4F:
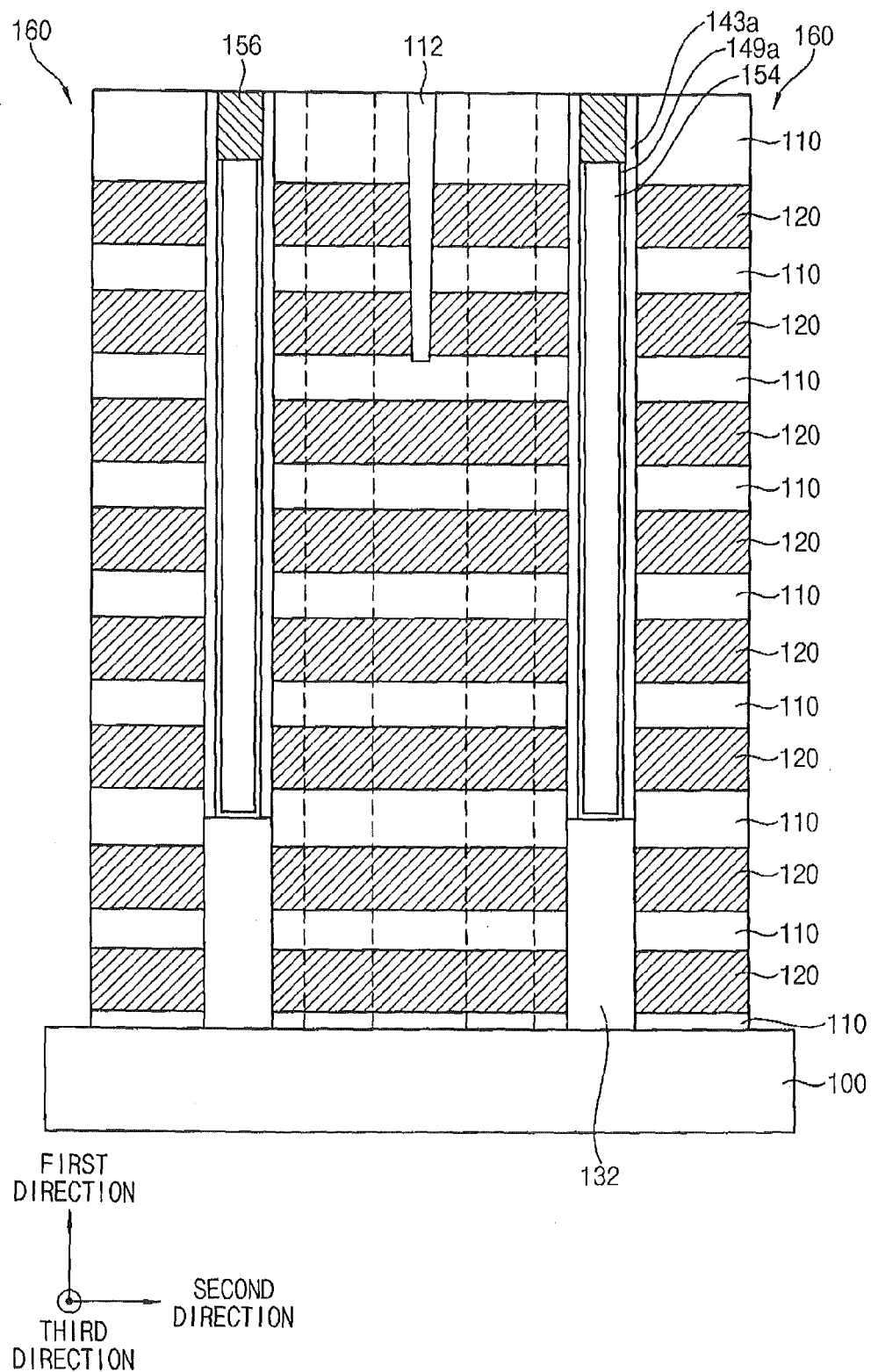

Referring to FIG. 4F, openings 160 penetrating the first insulating interlayers 110 and the sacrificial layers 120 may be formed to expose the upper surface of the substrate 100.

The openings 160 may be formed to define the gap portion between the word line structures. The openings 160 may be formed so as to be extended in the third direction. In addition, a plurality of the openings may be formed in the second direction. Through forming the openings 160, the insulating interlayers 110 and the sacrificial layers 120 may have a patterned shape.

The openings 160 may be disposed between the channel sets. That is, the openings 160 may divide each of the channel sets.

Figure 4G:
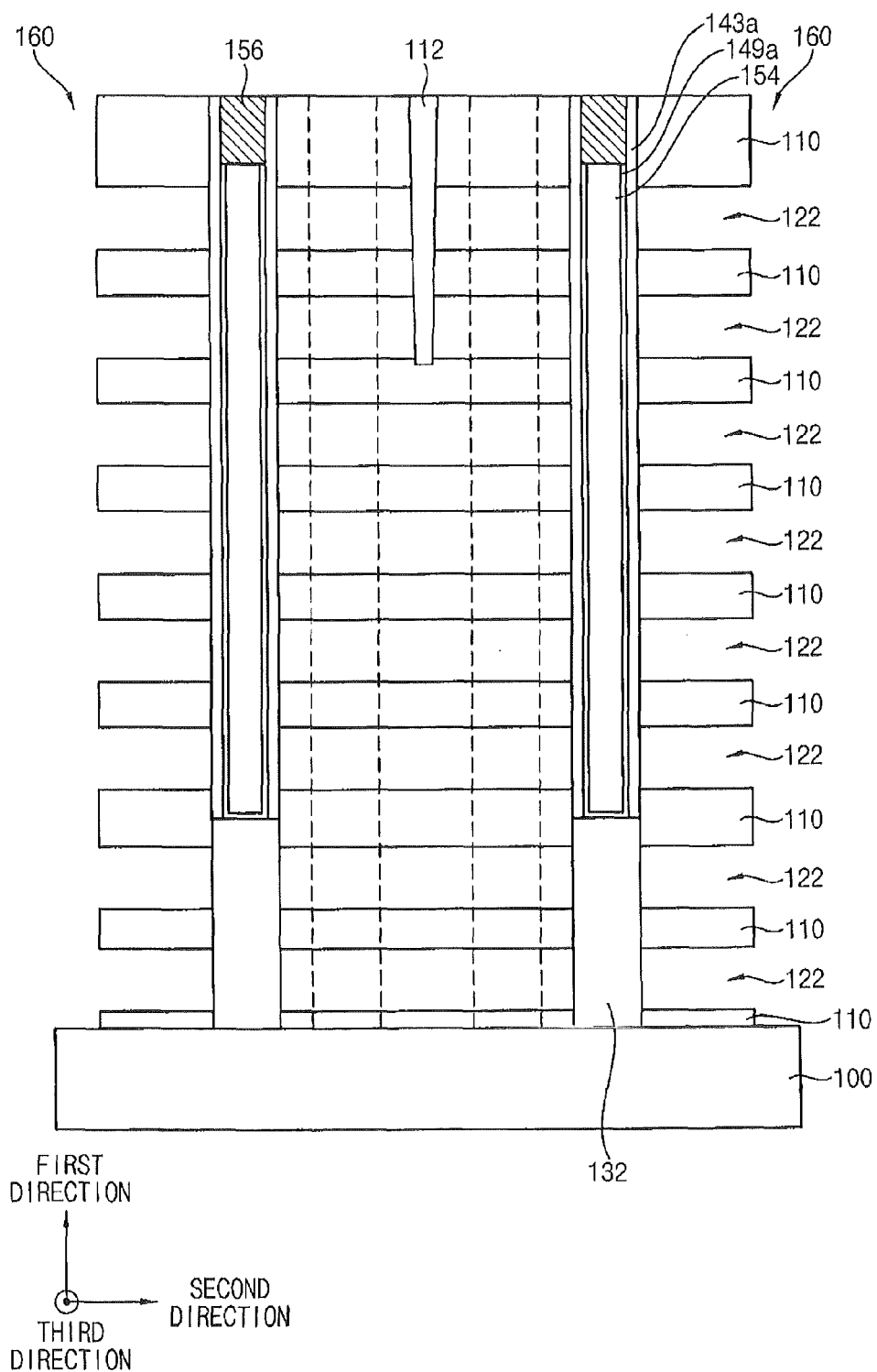
Figure 5C:
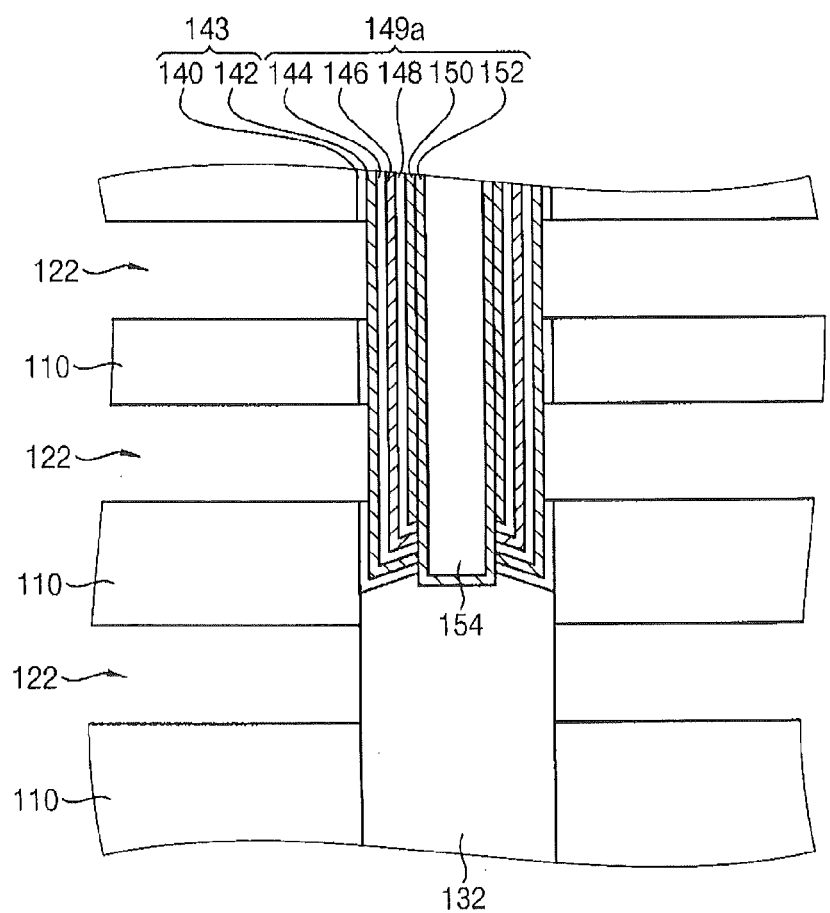

Referring to FIGS. 4G and 5C, the sacrificial layers 120 exposed to the side wall of the openings 160 in each layer may be removed to form a gap 122 between the first insulating interlayers 110. A portion of the side wall of the first polysilicon layer 142 and the semiconductor pattern 132 may be exposed by the gap.

The sacrificial layers 120 may be removed using a wet etching process using an etching solution having a high etching selectivity with respect to the first insulating interlayer 110. The etching solution may include phosphoric acid.

While conducting the etching process, the etching solution may readily penetrate into the sacrificial layer 120 adjacent to the opening portion 160 and so, a contacting time period with the etching solution during etching may be very long. However, the penetration of the etching solution may be delayed to the sacrificial layer 120 far from the opening portion 160 and so, the penetration may be conducted after a constant time from an initial etching to relatively shorten the contacting time period with the etching solution. Particularly, the sacrificial layer 120 making contact with the first and fourth rows adjacent to the opening portion in the channel set may have a long contacting time with the etching solution. However, since the etching solution may not readily penetrate into the sacrificial layer 120 adjacent to the second and third rows in the channel set but may penetrate after conducting the etching process for a time being to remove the sacrificial layer 120 near the first and fourth rows, the contacting time of the sacrificial layer with the etching solution may be relatively short.

Thus, when the etching process is not conducted for a sufficient time period, the sacrificial layer 120 adjacent to the second and third rows may not be removed but remain. Accordingly, an over etching process may be inevitable to completely remove the sacrificial layer 120.

While conducting the removing process of the sacrificial layer 120, the first silicon oxide layer 140 having a thin thickness may be removed together to expose the first polysilicon layer 142. Thus, the contacting time of the first polysilicon layer with the etching solution may be different according to the position. Particularly, the first polysilicon layer positioned at the first and fourth rows may contact the etching solution for a longer time than the polysilicon layer positioned at the second and third rows. However, since the first polysilicon layer 142 may be hardly etched by the etching solution, the thickness of the first polysilicon layer 142 included in the pillar structure of the first to fourth rows may be very uniform after conducting the removing process. In addition, the first blocking dielectric layer, the charge storing layer and the tunnel insulating layer covered by the first polysilicon layer 142 may be undamaged.

Accordingly, in a conventional method, after removing the sacrificial layer, the first blocking dielectric layer may be completely removed and a new first blocking dielectric layer may need to be re-deposited. However, in exemplary embodiments according to the inventive concept, since the first blocking dielectric layer may not be removed during removal of the sacrificial layer, the removal and re-deposition of the first blocking dielectric layer after removing the sacrificial layer may be avoided.

Alternatively, when the oxidation target layer 142 is not formed using polysilicon but using silicon nitride, the first silicon oxide layer 140 may be used as the etch stopping layer while removing the sacrificial layer 120. Thus, when the sacrificial layer 120 is removed the whole first silicon oxide layer 140 should not be consumed. In addition, after removing the whole sacrificial layer 120, an additional process for removing the first silicon oxide layer 140 may be used.

Figure 4H:
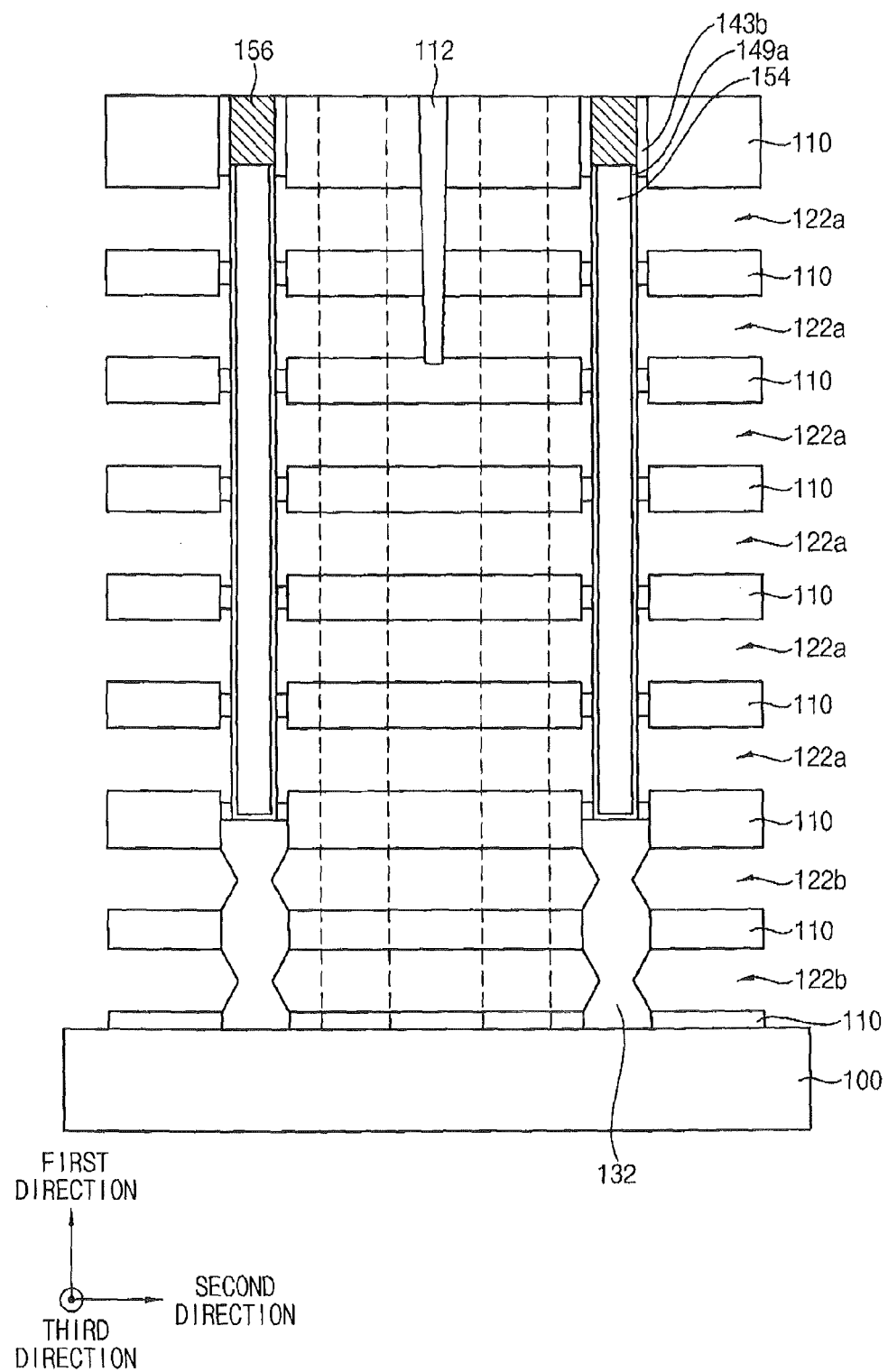
Figure 41:
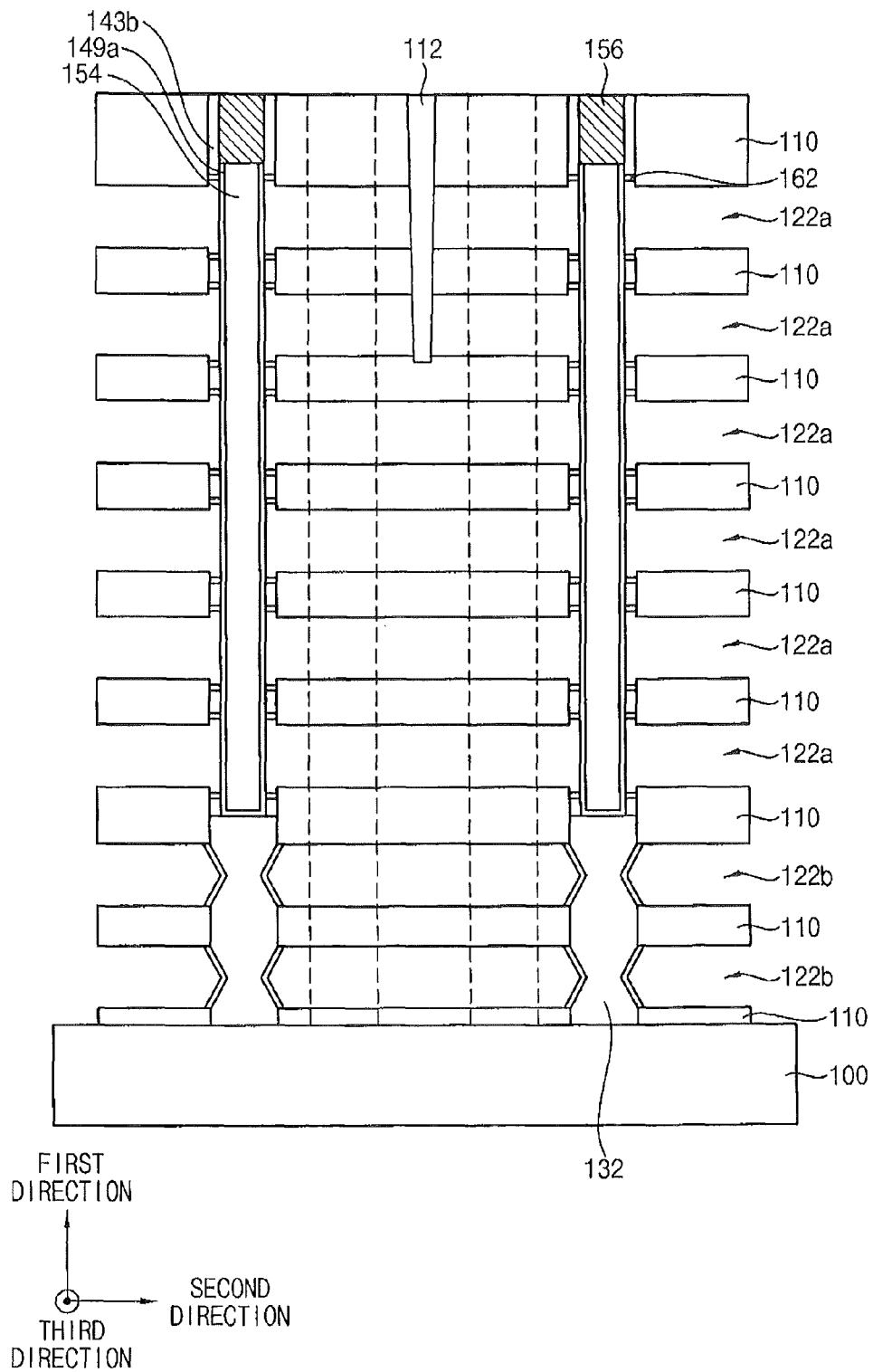
Figure 5D:
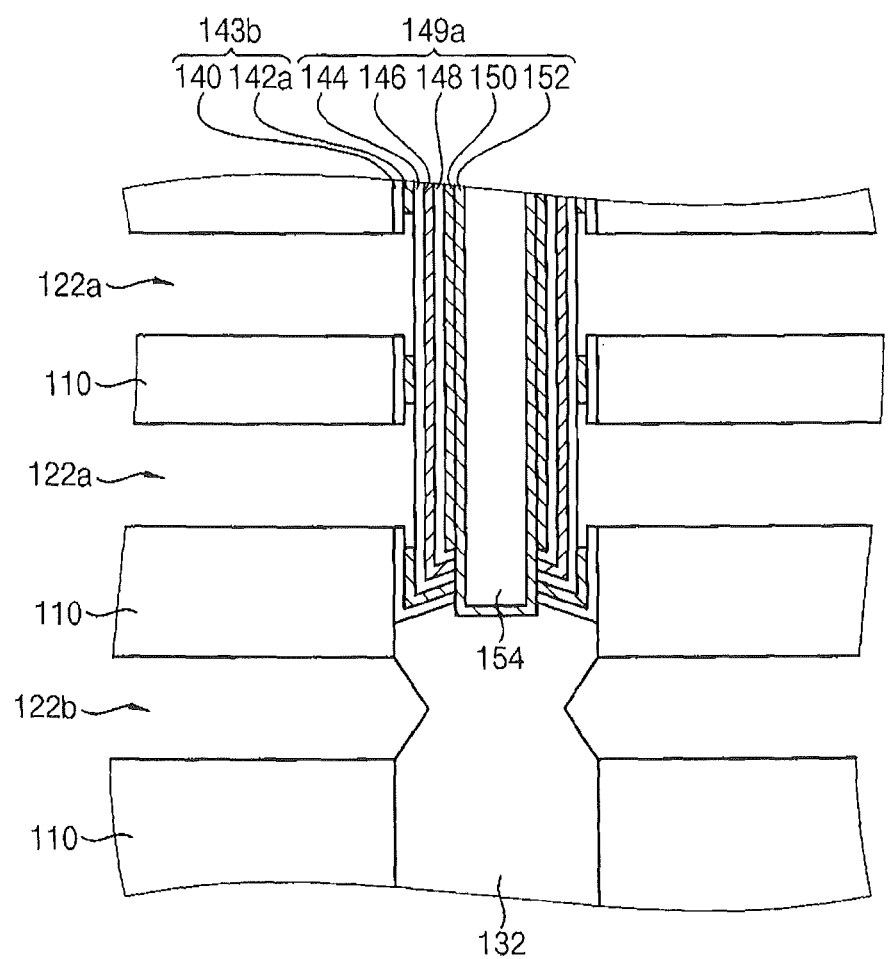

Referring to FIGS. 4H and 5D, the first polysilicon layer 142 exposed to the gap portion may be removed by conducting a wet etching process to selectively and slowly etch the first polysilicon layer 142. In addition, a portion of the first polysilicon layer making contact with the first insulating interlayer 110 may be removed. A first polysilicon pattern 142a having a lower height than the first insulating interlayer in each layer may be formed. In other words, the first polysilicon pattern 142a that remains at the removal of the sacrificial layer 120 may be further recessed between the first insulating interlayer 110 and the first blocking dielectric layer.

After conducting the wet etching process to remove a portion of the first polysilicon layer 142, the surface of the semiconductor pattern 132 exposed to the gap portion may be etched together. Thus, on the surface of the semiconductor pattern 132, a groove narrowed in the second direction may be formed. By forming the groove, the circumference of the semiconductor pattern 132 exposed by the gap 122b may be decreased.

Alternatively, when the oxidation target layer 140 is silicon nitride instead of polysilicon, the surface of the semiconductor pattern may not be etched. In this case, the semiconductor pattern portion may have the same shape as illustrated in FIG. 10A.

Through the above-described process, a first polysilicon pattern 142a having a smaller height than the first insulating interlayer 110 may be formed. As illustrated in the drawings, the gap 122a may have a cylinder shape with the side wall portion of the channel pattern as a bottom surface. The width at the bottom portion of the cylinder may have an enlarged shape compared to the upper width of the cylinder (away from the sidewall and closer to the opening).

As described above, in the etching process to form the gaps 122a and 122b, an etching solution, for example, hydrogen fluoride (HF) may not be used for directly removing the silicon oxide or cleaning the silicon oxide residue. In addition, since the etching process may be conducted by a condition having a high etching selectivity with respect to the silicon oxide, the silicon oxide may be hardly removed. Thus, the first insulating interlayer 110 formed by using silicon oxide may be hardly removed during the etching process.

Since the first insulating interlayer 110 may be hardly removed as described above, the first insulating interlayer 110 may not be necessary to be formed to have excess thickness to compensate for the consumption of a portion of the first insulating interlayer 110. Thus, the total height of the mold structure including the stacked structure of the first insulating interlayer 110 and the sacrificial layer 120 may be decreased. In addition, the number of the floors of the sacrificial layers 120 formed in the mold structure having the same height may be increased, more word line structures may be stacked, and the integration degree of semiconductor devices may be increased.

Figure 5E:
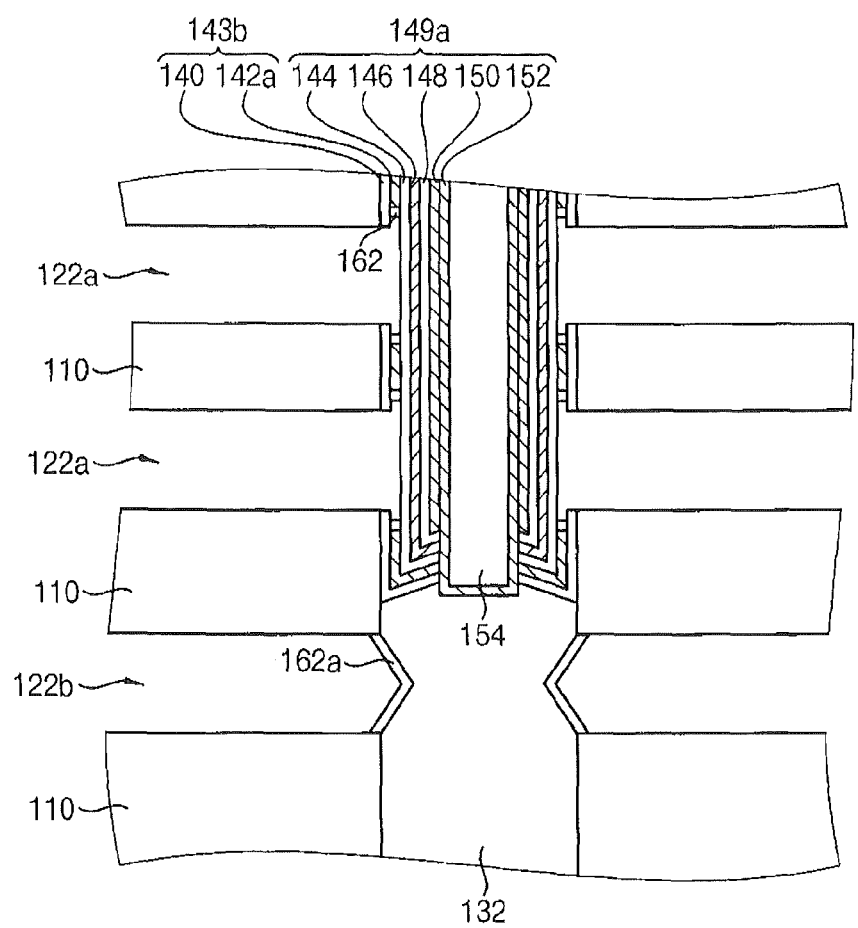

Referring to FIGS. 4I and 5E, an oxidation process may be conducted to oxidize the surfaces of the first polysilicon pattern 142a and the semiconductor pattern exposed to the gaps 122a and 122b. The oxidation process may include a radical oxidation process or a plasma oxidation process.

Through conducting the oxidation process, a second silicon oxide layer pattern 162 may be formed on the exposed surface of the first polysilicon pattern 142a. Thus, the first polysilicon pattern may have a shape being surrounded by silicon oxide. In addition, by forming the second silicon oxide layer pattern 162, the first polysilicon pattern 142a may be electrically insulated from the word line structure to be formed in a following process.

In addition, the exposed surface of the semiconductor pattern 132 by the gap 122a may also be oxidized to form a silicon oxide layer pattern 162a.

Figure 4J:
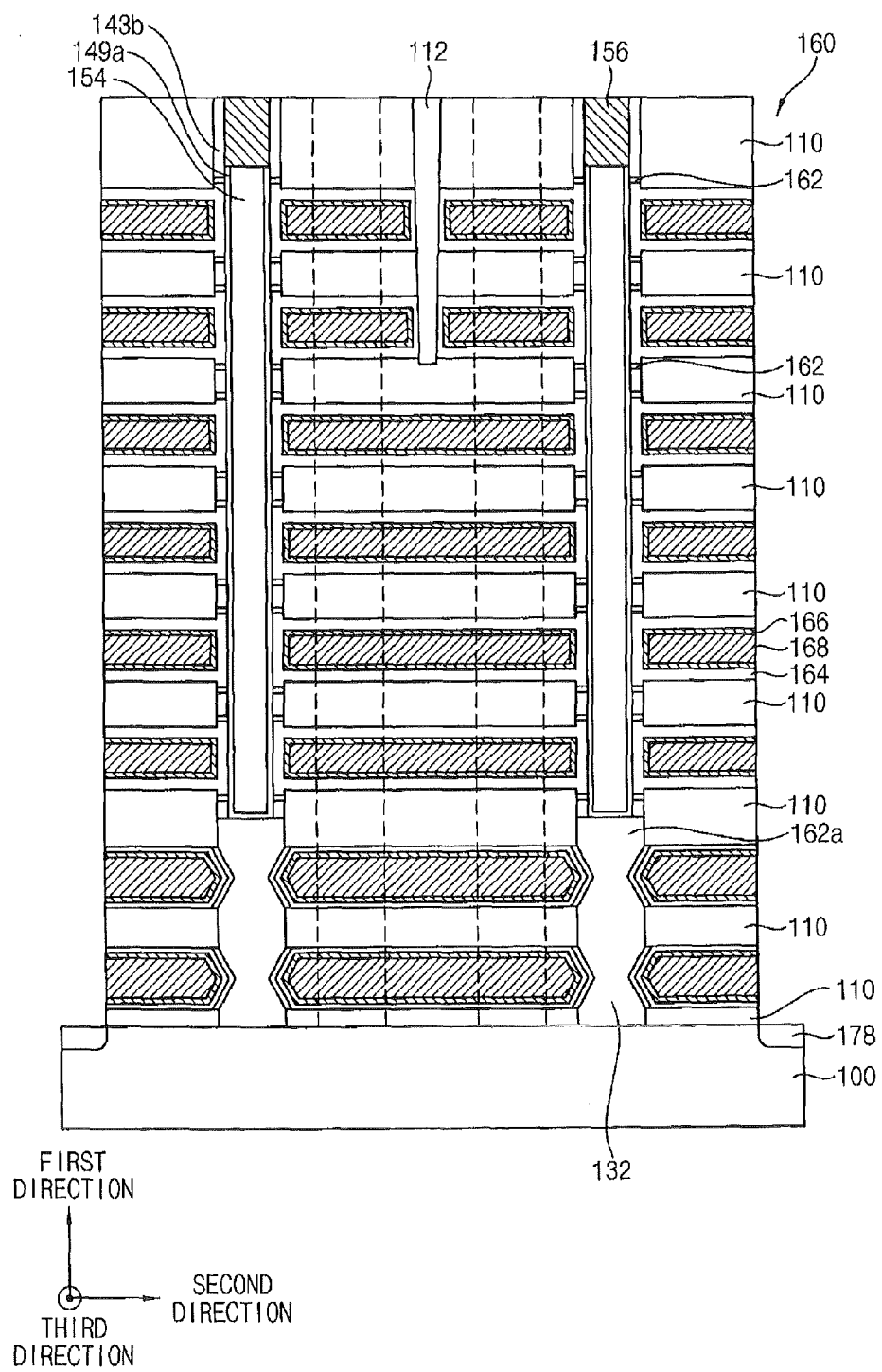
Figure 5F:
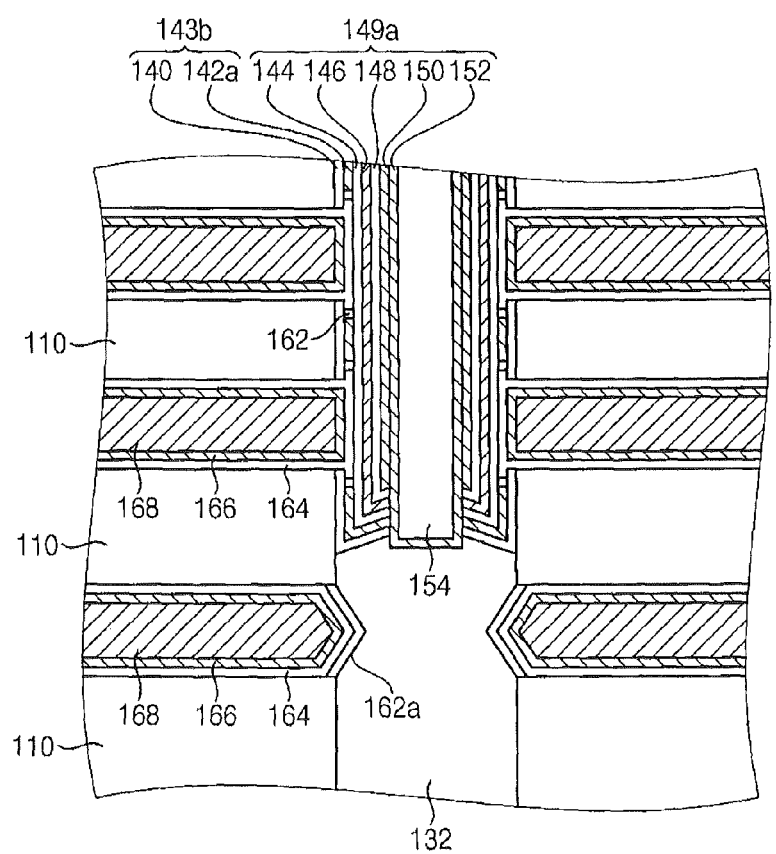

Referring to FIGS. 4J and 5F, a second blocking dielectric layer 164 may be formed along the profile of the first insulating interlayer 110, the first blocking dielectric layer 144, the first silicon oxide layer 140 and the second silicon oxide layer pattern 162 in the gap.

In this example embodiment, since the first blocking dielectric layer 144 may be formed at the pillar structure in advance, a silicon oxide layer as the first blocking dielectric layer may not be re-deposited. Thus, the second blocking dielectric layer 164 may be formed on the first blocking dielectric layer 144.

Then, a barrier metal layer 166 may be formed on the second blocking dielectric layer 164, and a metal layer 168 completely filling up the gaps 122a and 122b portion may be formed.

The second blocking dielectric layer 164 may be formed by using a material having a higher dielectricity than the first blocking dielectric layer 144. The second blocking dielectric layer 164 may comprise a metal oxide. Examples of the metal oxide used for the second blocking dielectric layer may include aluminum oxide, hafnium oxide, lanthanum oxide, lanthanum aluminum oxide, lanthanum hafnium oxide, hafnium aluminum oxide, titanium oxide, tantalum oxide, zirconium oxide, etc.

The barrier metal layer 166 and the metal layer 168 may be provided as word lines in a following process. The barrier metal layer 166 may be formed by using a metal nitride such as titanium nitride and tantalum nitride. The metal layer 168 may comprise a metal having a low electric resistance. Examples of the metal used for metal layer include tungsten, titanium, tantalum, platinum, etc.

Then, the metal layer 168 and the barrier metal layer 166 formed in the opening portion 160 may be removed to form first and second word line structures respectively in the gaps 122a and 122b. The removing process may include a wet etching process.

The first word line structure 169a may be formed at the side wall portion of the channel patterns 150 and 152. The first word line structure 169a making contact with the side wall portion of the channel patterns 150 and 152 may be relatively high. The first word line structure may be provided as the gate of a cell transistor and the SSL of a selecting transistor.

The second word line structure 169b may be formed at the side wall portion of the semiconductor pattern 132. The second word line structure 169b may be provided as the GSL. The second word line structure 169b making contact with the side wall of the semiconductor pattern 132 may not have an enlarged height but may have a decreased height. In addition, the side wall of the second word line structure 169b making contact with the semiconductor pattern 132 may not be vertical but may have a slope to upward and downward to have a sharp and laterally extruding (or protruding) shape.

Impurities may be doped into the upper portion of the exposed substrate 100 to form an impurity region 178 (FIG. 1). The impurities may include n-type impurities such as phosphor and arsenic. The impurity region 178 may be extended in the third direction and function as a common source line (CSL).

On the impurity region 178, a metal silicide pattern such as a cobalt silicide pattern or a nickel silicide pattern may be further formed.

Referring to FIG. 1 again, a second burying insulating layer pattern 176 filling up the opening 160 may be formed.

An upper insulating interlayer may be formed on the thus formed structures, and contact holes exposing the upper surface of the pad 156 may be formed. In the contact holes, a bit line contact may be formed, and a bit line making contact with the upper portion of the bit line contact may be formed.

According to the above-described process, the surface of the oxidation target layer may be oxidized to form an oxide having an insulating property. Thus, the oxidation target layer and other conductive patterns may be insulated from each other. Particularly, when the oxidation target layer is polysilicon, since the polysilicon has a high etching selectivity with respect to an etching solution for removing the sacrificial layer, the consumption of the first insulating interlayers may be decreased.

FIGS. 6A to 6F are cross-sectional views illustrating other methods of manufacturing the vertical type semiconductor device in accordance with Example Embodiment 1.

FIGS. 6A to 6F are enlarged views on section A in FIG. 1.

First, the structure illustrated in FIG. 4C may be formed by conducting the same procedure described referring to FIGS. 4A to 4C.

Figure 6A:
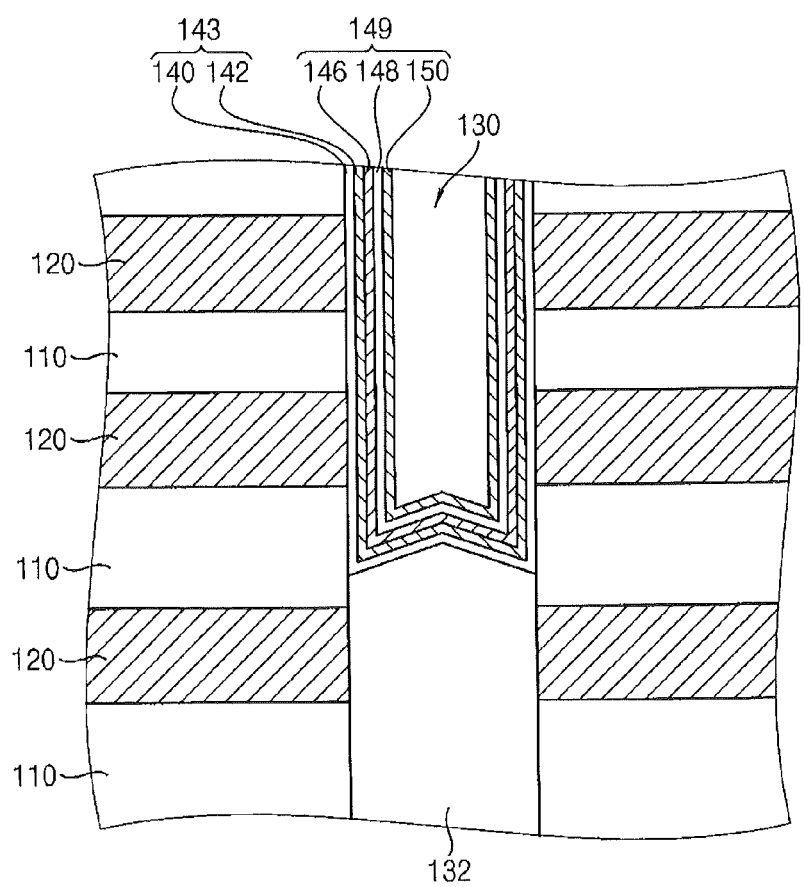
FIGS. 6A to 6F are cross-sectional views illustrating methods of manufacturing the vertical type semiconductor device in accordance with FIG. 1.

Referring to FIG. 6A, on the inner side wall of the channel holes 130, on the upper surface of the semiconductor pattern 132 and on the upper surface of the hard mask, a first silicon oxide layer 140, an oxidation target layer 142, a charge storing layer 146, a tunnel insulating layer 148 and a polysilicon layer 150 may be formed one by one.

The oxidation target layer 142 may include a material for forming an oxide having an insulating property through an oxidation process. Particularly, the oxidation target layer 142 may include polysilicon or silicon nitride. Hereinafter, the oxidation target layer 142 may be called as the first polysilicon layer, and the polysilicon layer 150 may be called as a second polysilicon layer. However, silicon nitride layer may be used as the oxidation target layer.

On the second polysilicon layer 150, silicon oxide and silicon nitride may be further formed. The silicon oxide and the silicon nitride may be layers for passivating the second polysilicon layer 150.

In this example embodiment, in contrast to FIG. 5A, the first blocking dielectric layer may not be formed in the channel holes. Thus, the first polysilicon layer 142 may have a shape making direct contact with the charge storing layer. In exemplary embodiments, the oxidation target layer 142 may substantially function as a vertical blocking sacrificial layer to prevent the damage of the pillar structure. Thus, a layer functioning as the vertical blocking sacrificial layer may not be necessary to be formed while forming the pillar structure. Thus, the first blocking dielectric layer provided as a substantial dielectric layer may be formed in a following process.

Figure 6B:
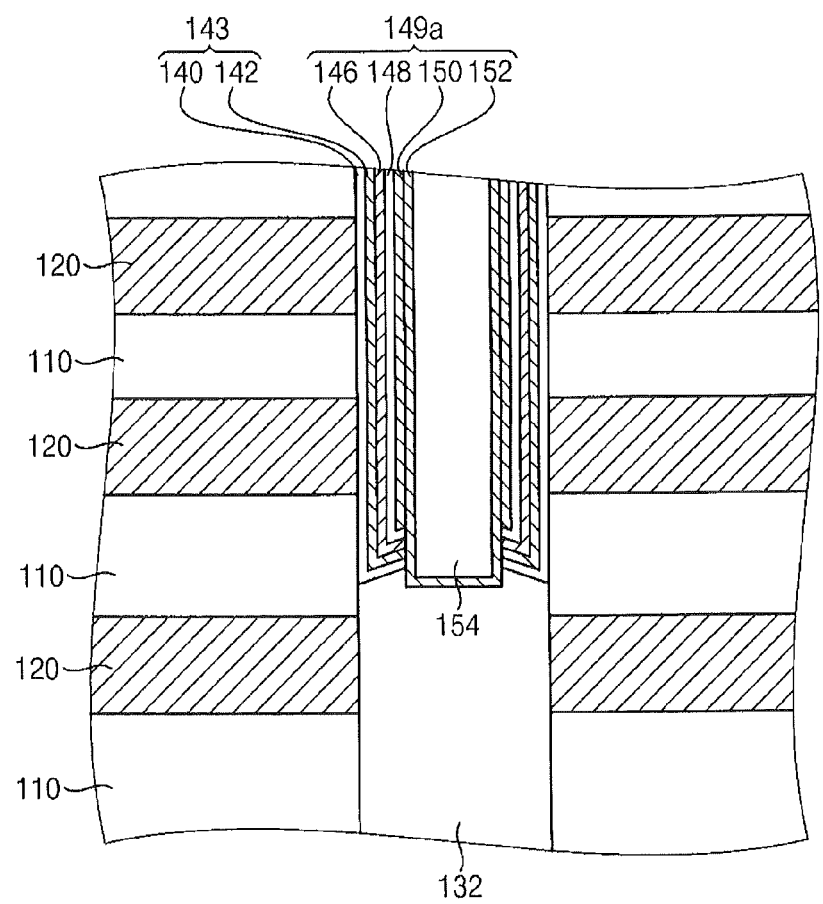

Referring to FIG. 6B, the bottom surface of the second polysilicon layer 150, the tunnel insulating layer 148, the charge storing layer 146, the first polysilicon layer 142 and the first silicon oxide layer 140 may be etched to expose the upper portion of the semiconductor pattern 132.

Through conducting the etching process, the second polysilicon layer 150, the tunnel insulating layer 148, the charge storing layer 146, the first polysilicon layer 142 and the first silicon oxide layer 140 may remain as a spacer shape on the side wall of the channel hole 130.

Then, on the surface of the second polysilicon layer 150 and the semiconductor pattern 132, a third polysilicon layer 152 may be formed. The second and third polysilicon layers 150 and 152 may be provided as channel patterns. The channel patterns 150 and 152 may make contact with the semiconductor pattern and may have a cylinder shape.

An insulating layer may be formed to completely fill up the inner portion of the channel holes 130. Then, the insulating layer may be polished to form a first burying insulating layer pattern 154. The first burying insulating layer pattern 154 may include silicon oxide.

In succession, a portion of the upper portion of the first burying insulating layer pattern 154 may be removed to form openings. A polysilicon layer may be formed in the openings and polished to form a pad 156 (see FIG. 4E).

Figure 6C:
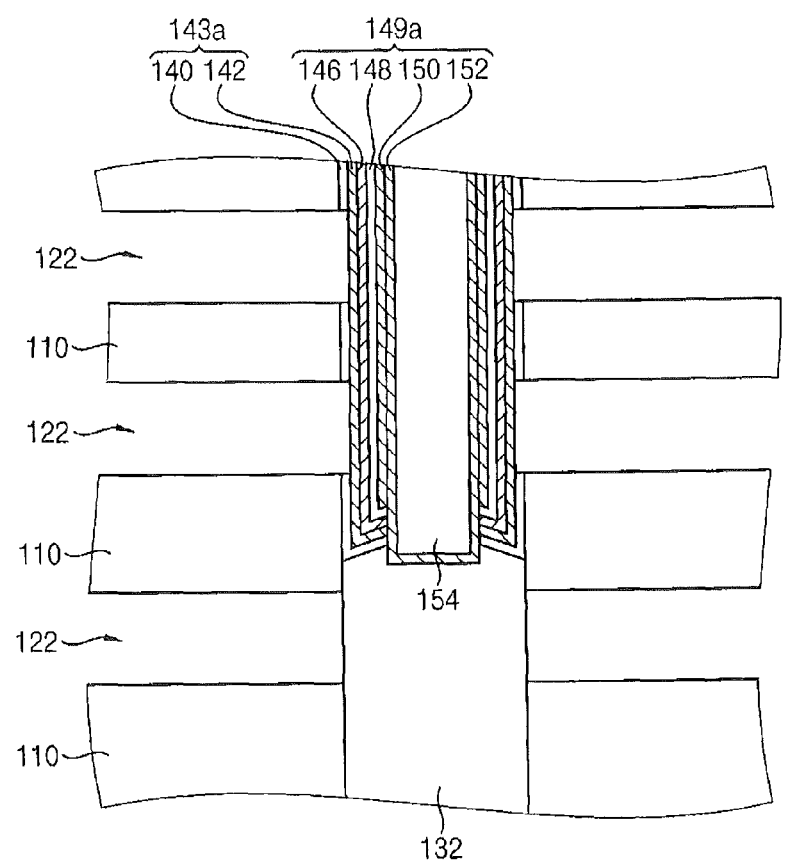

Referring to FIG. 6C, openings 160 (see FIG. 4F) penetrating the first insulating interlayers 110 and the sacrificial layers 120 may be formed to expose the upper surface of the substrate 100. The openings 160 may be extended in the third direction. In addition, a plurality of the openings 160 may be formed in the second direction. Through forming the openings 160, the first insulating interlayers 110 and the sacrificial layers 120 may have a patterned shape.

By removing the sacrificial layers 120 exposed to the side wall of the opening 160 in each layer, a gap 122 may be formed between the first insulating interlayers 110. By forming the gap 122, a portion of the side wall of the first polysilicon layer and the semiconductor pattern 132 may be exposed. The sacrificial layers 120 may be removed using a wet etching process with an etching solution having a high etching selectivity with respect to the first insulating interlayer 110. The etching solution may include phosphoric acid.

The first silicon oxide layer 140 formed to have a small thickness may be removed together while conducting the removing process of the sacrificial layer 120 to expose the first polysilicon layer 142. However, since the first polysilicon layer 142 may be hardly etched, the thickness of the first polysilicon layer 142 included in the first to fourth pillar structures may be uniform.

Figure 6D:
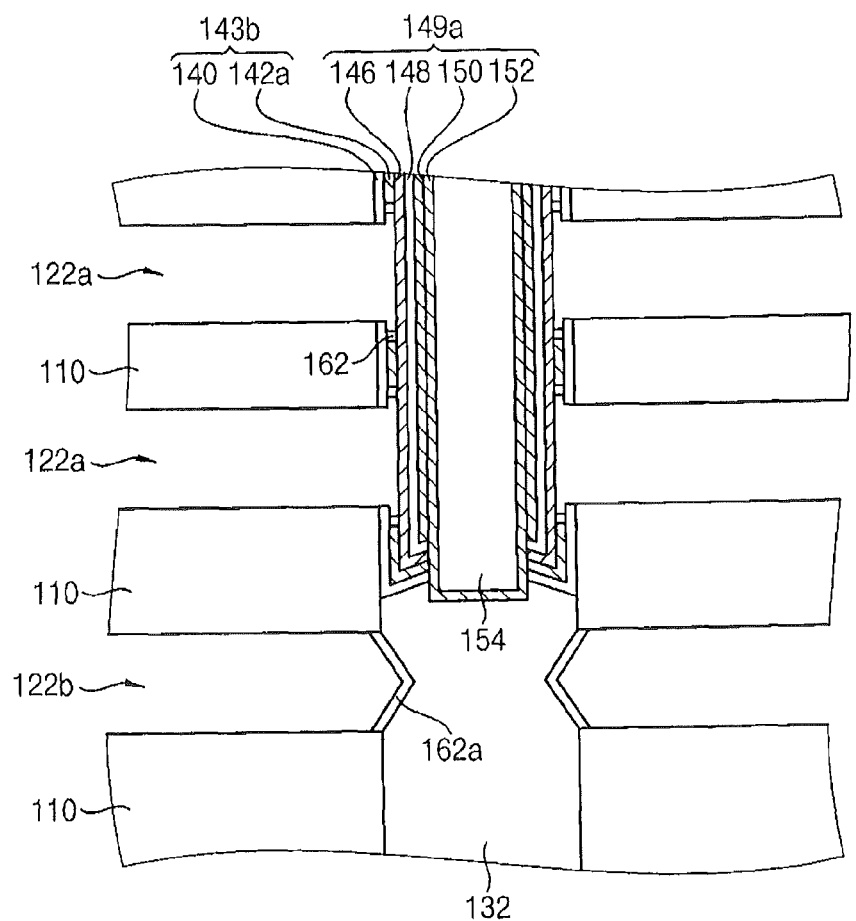

Referring to FIG. 6D, a wet etching process for selectively and slowly etching the first polysilicon layer 142 may be conducted to remove the exposed first polysilicon layer 142 to the gap portion. In addition, a portion of the first polysilicon layer 142 making contact with the first insulating interlayer 110 may be removed. Thus, a first polysilicon pattern 142a having a smaller height than the first insulating interlayer in each layer may be formed.

Through conducting a wet etching process for removing a portion of the first polysilicon layer 142, the surface of the semiconductor pattern 132 exposed to the gap 122b portion may be etched together. Thus, a groove narrowed in the second direction may be formed on the surface of the exposed semiconductor pattern 132.

In another embodiment, the surface of the semiconductor pattern may be hardly etched when the oxidation target layer may comprise silicon nitride instead of polysilicon.

Through conducting the above process, the first polysilicon pattern 142a having a smaller height than the first insulating interlayer 110 may be formed. As illustrated in FIG. 6D, the gap 122a may have a cylinder shape having the side wall portion of the channel pattern as a bottom surface, and the width at the bottom surface portion of the cylinder may have an enlarged shape than the upper width of the cylinder.

An oxidation process may be conducted to oxidize the surface of the first polysilicon pattern 142a and the semiconductor pattern 132 exposed to the gaps 122a and 122b. The oxidation process may include a radical oxidation process or a plasma oxidation process. Through conducting the oxidation process, a second silicon oxide layer pattern 162 may be formed on the exposed surface of the first polysilicon pattern 142a. The silicon oxide layer pattern 162a may be formed on the exposed surface of the semiconductor pattern 132.

Figure 6E:
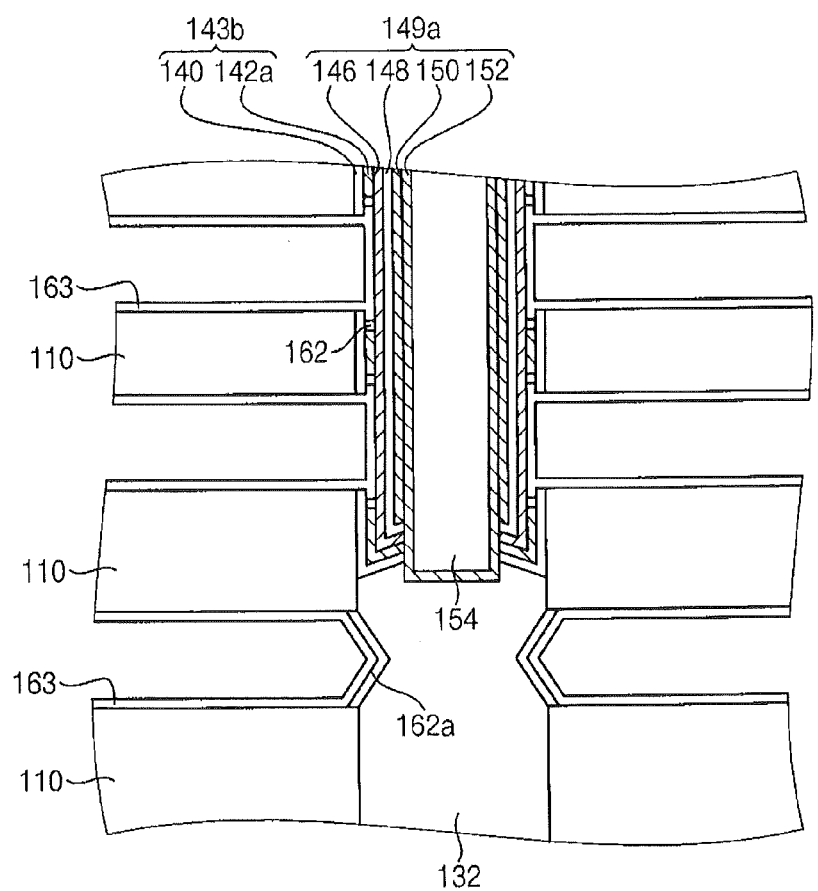

Referring to FIG. 6E, a first blocking dielectric layer 163 may be formed along the profile of the first insulating interlayer 110, the first silicon oxide layer 140 and the second silicon oxide layer pattern 162 in the gap. The first blocking dielectric layer 163 may be formed by depositing silicon oxide by a chemical vapor deposition method.

Figure 6F:
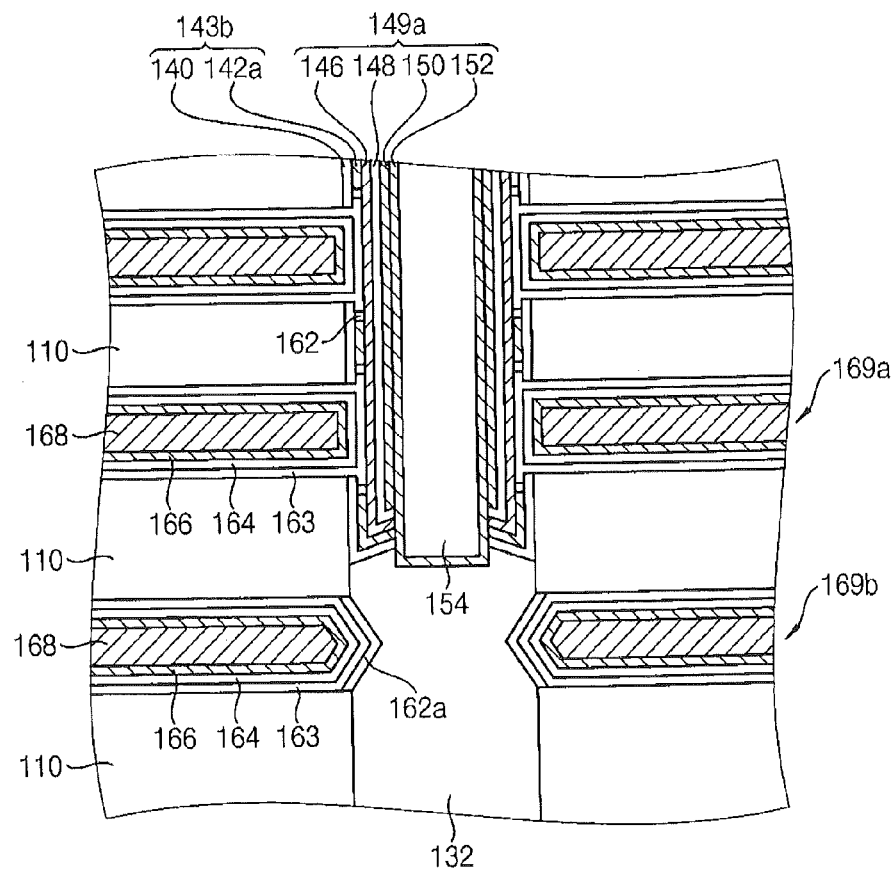

Referring to FIG. 6F, a second blocking dielectric layer 164 may be formed on the first blocking dielectric layer 163. Then, a barrier metal layer 166 may be formed on the second blocking dielectric layer 164, and a metal layer 168 completely filling up the gap portion may be formed.

Then, the metal layer 168 and the barrier metal layer 166 formed on the side wall of the opening portion 160 may be removed by a wet etching process to form an opening portion again. Through conducting the above-described process, first and second word line structures 169a and 169b may be formed in the gaps 122a and 122b, respectively.

Through conducting the above-described process, a vertical type semiconductor device as illustrated in FIG. 1 may be manufactured.

According to the above-described process, by forming an oxide having an insulating property by oxidizing the surface of the oxidation target layer, the oxidation target layer and other conductive patterns may be insulated from each other. In addition, the process of forming the first blocking dielectric layer between the oxidation target layer and the charge storing layer may be omitted.

Figure 7A:
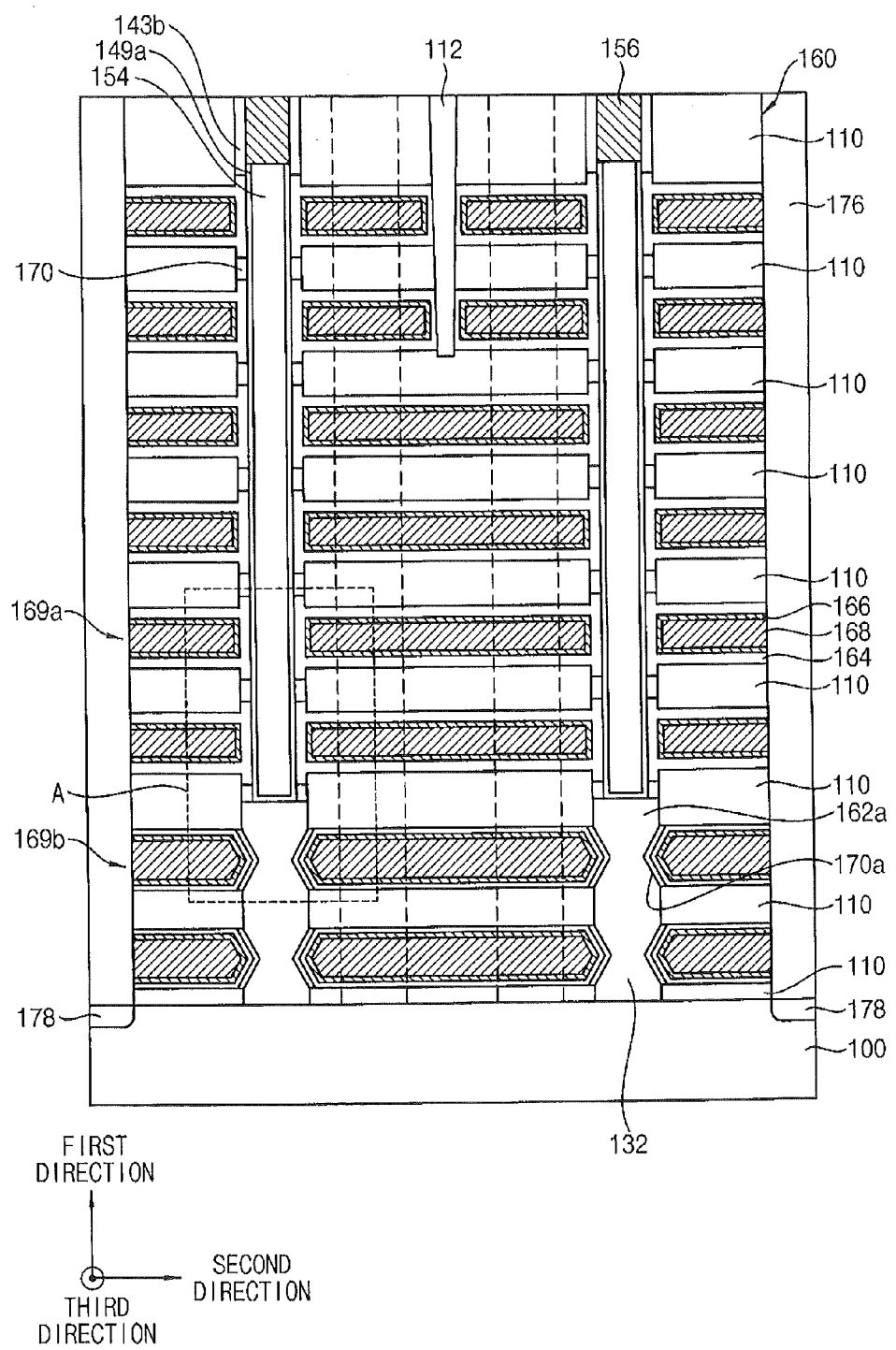
FIG. 7A is a cross-sectional view illustrating a vertical type semiconductor device in accordance with some embodiments of the present inventive concept.
Figure 7B:
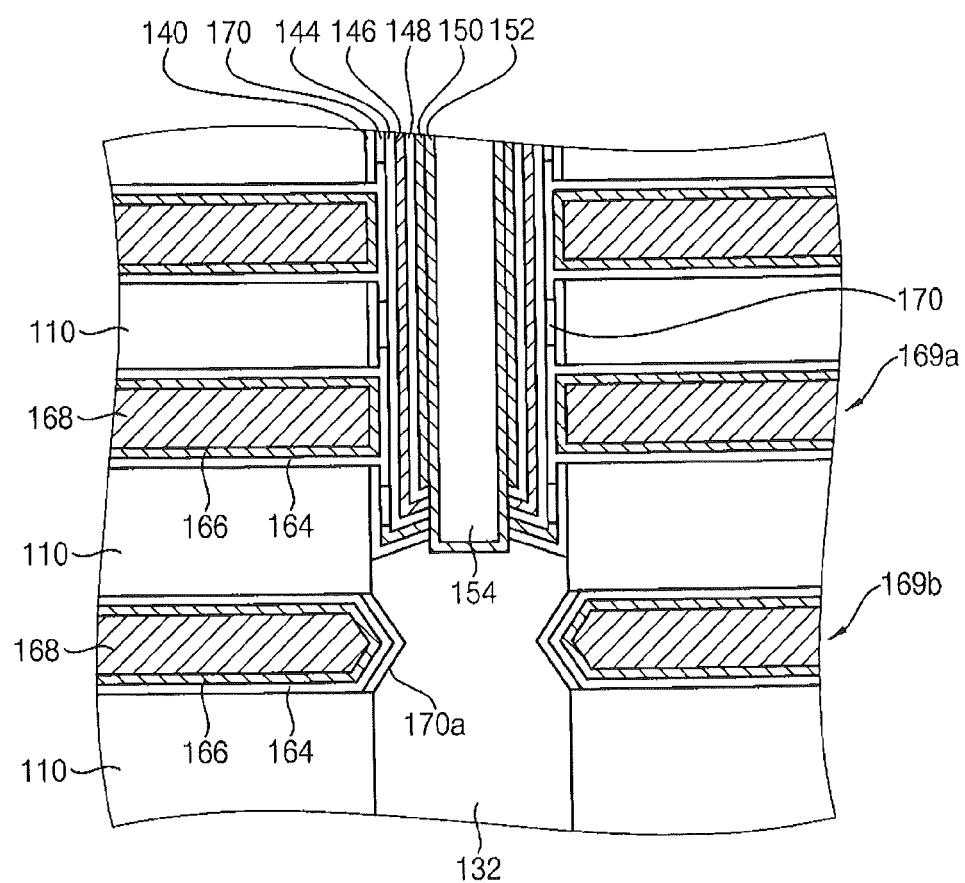
FIG. 7B is an enlarged cross-sectional view of section A in FIG. 7A.

FIG. 7A is a cross-sectional view illustrating a vertical type semiconductor device in some embodiments according to the inventive concept. FIG. 7B is an enlarged cross-sectional view of section A in FIG. 7A.

The vertical type semiconductor device in this example embodiment may have the same structure as the vertical type semiconductor device illustrated in FIG. 1 except for the first insulating layer structure.

In FIG. 7A, channel patterns 150 and 152, a tunnel insulating layer 148, a charge storing layer 146 and a first blocking dielectric layer 144 may be illustrated as one layer 149a. However, the thin layers may have the same stacked structure as illustrated in FIG. 7B.

Referring to FIGS. 7A and 7B, in a vertical type memory device, first insulating layer structures 110 and 170 in each layer may include a first portion making contact with the side wall of the pillar structure and a second portion disposed laterally from the first portion. As described above, the first direction height of the first portion may be lower than the first direction height of the second portion.

In this example embodiment, the first portion of first insulating layer structures 110, 140 and 170 may include a second silicon oxide layer pattern 170. The second silicon oxide layer pattern 170 may be a thermal oxidation layer formed through a thermal oxidation of the whole material constituting the oxidation target layer.

The second portion may include a first insulating interlayer 110 and a first silicon oxide layer 140 formed by using silicon oxide by means of a chemical vapor deposition method. The first insulating interlayer 110 may be silicon oxide formed through the chemical vapor deposition process.

In this example embodiment, the oxidation target layer pattern may not be included in the first insulating layer structures 110, 140 and 170.

Since the first portion of the first insulating layer structures 110, 140 and 170 may be lower than the second portions 110 and 140, the gap 122a portion between the first portions may be relatively wide. Thus, the width of the lower portion of the first word line structure 169a formed at the gap 122a portion may be enlarged in the first direction. That is, the second silicon oxide layer pattern 170 may have a smaller height than the first insulating interlayers 110.

The second word line structure 169b may have the same shape as explained referring to FIG. 1.

The first and second word line structures 169a and 169b and the first insulating layer structures may be stacked in the first direction, and the stacked structures may be extended in the third direction. Thus, an opening 160 having a trench shape for separating the stacked structures may be provided between the stacked structures. The inner portion of the opening portion 160 may be filled up with a second burying insulating layer pattern 176.

On the substrate 100 under the second burying insulating layer pattern 176, an impurity region 178 extended in the third direction and functioning as a common source line (CSL) may be formed.

A bit line may be electrically connected to a pad 156 through a bit line contact and may be electrically connected to the channel patterns 150 and 152. The bit line may include a metal, a metal nitride, doped polysilicon, etc.

Figure 8A:
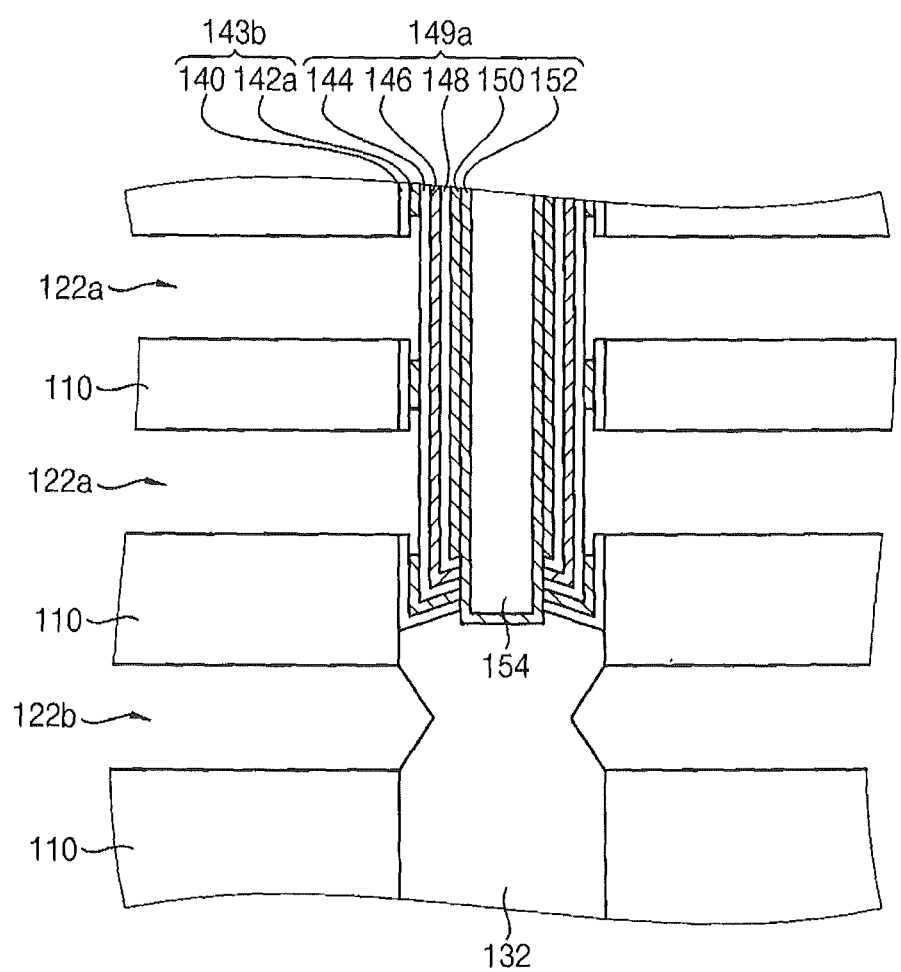
FIGS. 8A and 8B are cross-sectional views illustrating methods of forming the vertical type semiconductor device illustrated in FIG. 7A.
Figure 8B:
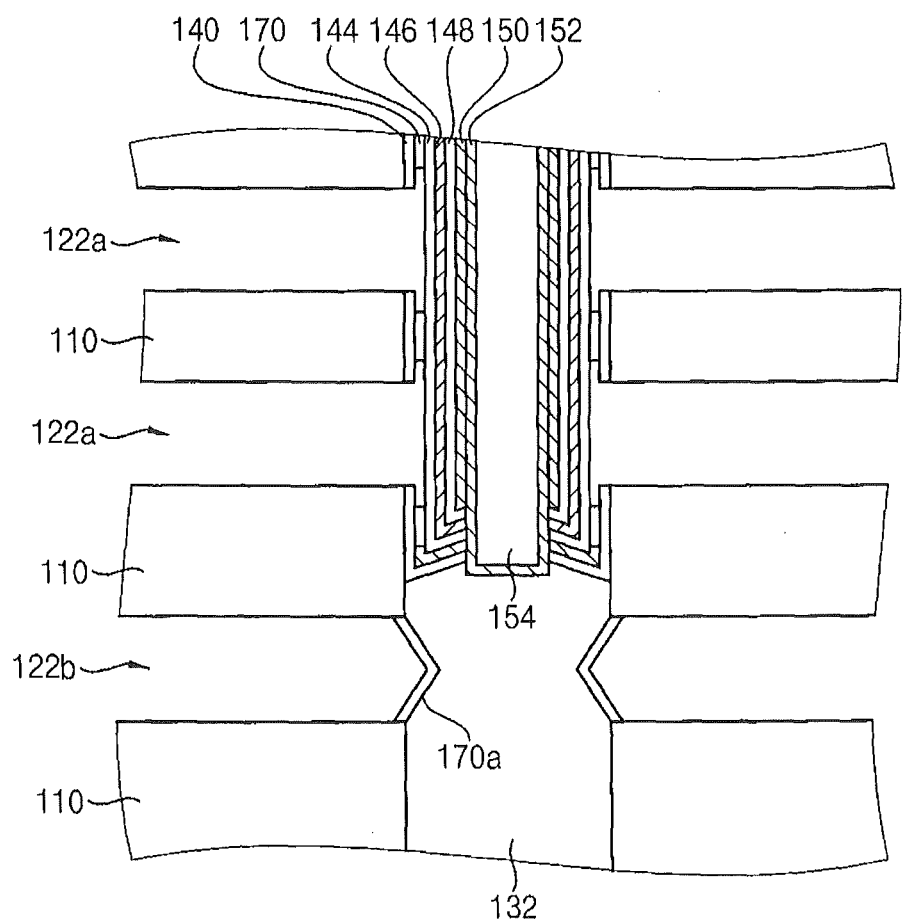

FIGS. 8A and 8B are cross-sectional views illustrating methods of manufacturing the vertical type semiconductor device illustrated in FIG. 7A.

FIGS. 8A and 8B are an enlarged views on section A in FIG. 7A.

The same procedure explained referring to FIGS. 4A to 4H may be utilized in conjunction with those illustrated in FIGS. 8A and 8B. Through conducting the above-described processes, a structure illustrated in FIG. 8A may be formed. Hereinafter, the oxidation target layer pattern may be explained as a first polysilicon pattern. However, the oxidation target layer pattern may be also formed by silicon nitride.

Referring to FIG. 8B, the whole first polysilicon pattern 142a exposed to the gap portion may be oxidized to change the first polysilicon pattern into a second silicon oxide layer pattern 170. In this case, at the exposed side wall of the semiconductor pattern 132, a silicon oxide layer pattern 170a may be formed by an oxidation reaction. The oxidation process may include a radical oxidation process or a plasma oxidation process. Thus, the second silicon oxide layer pattern 170 may be formed as a thermal oxidation layer.

In a previous process, the height of the first polysilicon pattern, which may be an oxidization target may be largely decreased by the etching of polysilicon. Thus, through conducting a rapid oxidation process, a second silicon oxide layer pattern 170 may be formed.

In this example embodiment, since the whole first polysilicon pattern 142a may be oxidized, polysilicon may not be provided in the first insulating structure.

As illustrated in the drawings, the second silicon oxide layer pattern 170 may make contact with the pillar structure, and the height in the first direction may be smaller than the height of the first insulating interlayer 110. Thus, the gap portion adjacent to the pillar structure may have an enlarged shape in a vertical direction due to the second silicon oxide layer pattern 170.

Referring to FIG. 7B again, a second blocking dielectric layer 164 may be formed along the profile of the insulating interlayer 110, the first blocking dielectric layer 144, the first silicon oxide layer 140 and the second silicon oxide layer patterns 170 and 170a in the gaps 122a and 122b. Then, a barrier metal layer 166 may be formed on the second blocking dielectric layer 164, and a metal layer 168 completely filling up the gap portion may be formed. Then, the metal layer 168 and the barrier metal layer 166 formed in the opening portion 160 may be removed to form first and second word line structures 169a and 169b in the gaps 122a and 122b, respectively.

The above-described processes may be the same as the explanation referring to FIGS. 4J and 5F.

Through conducting the above-described processes, the vertical type semiconductor device illustrated in FIGS. 7A and 7B may be formed.

In this example embodiment, the surface of the oxidation target layer may be oxidized to form an oxide having an insulating property to insulate the oxidation target layer and other conductive patterns from each other. Particularly when polysilicon is used as the oxidation target layer, since the etching selectivity of the polysilicon layer may be high with respect to an etching solution for removing the sacrificial layer, the consumption of the first insulating interlayers may be decreased.

Figure 9A:
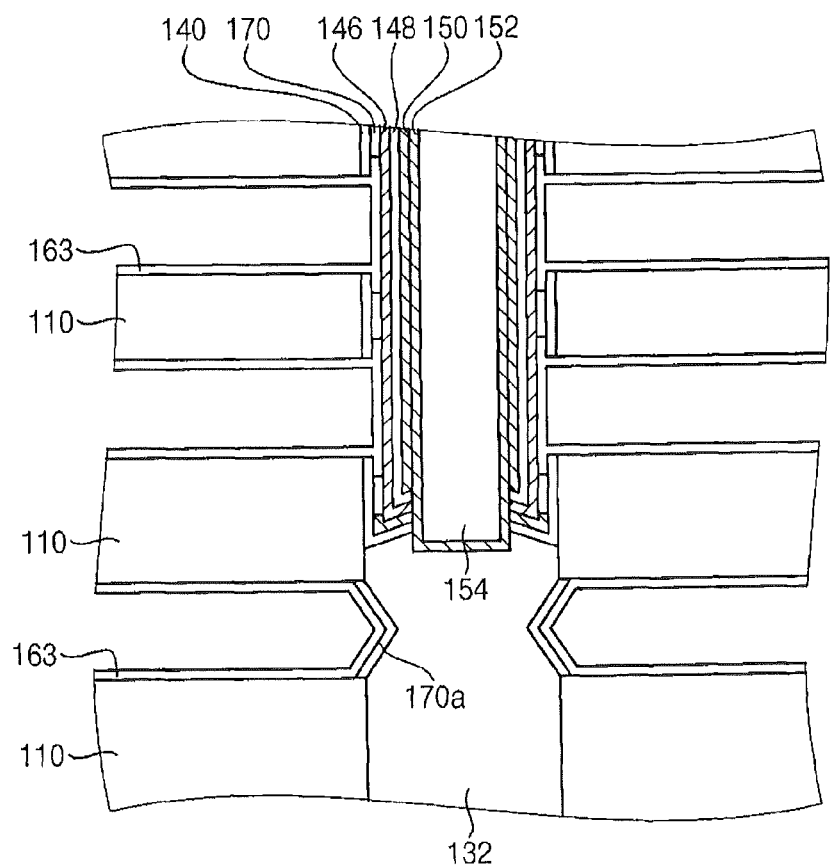
FIGS. 9A and 9B are cross-sectional views illustrating methods of forming the vertical type semiconductor device illustrated in FIG. 7A.
Figure 9B:
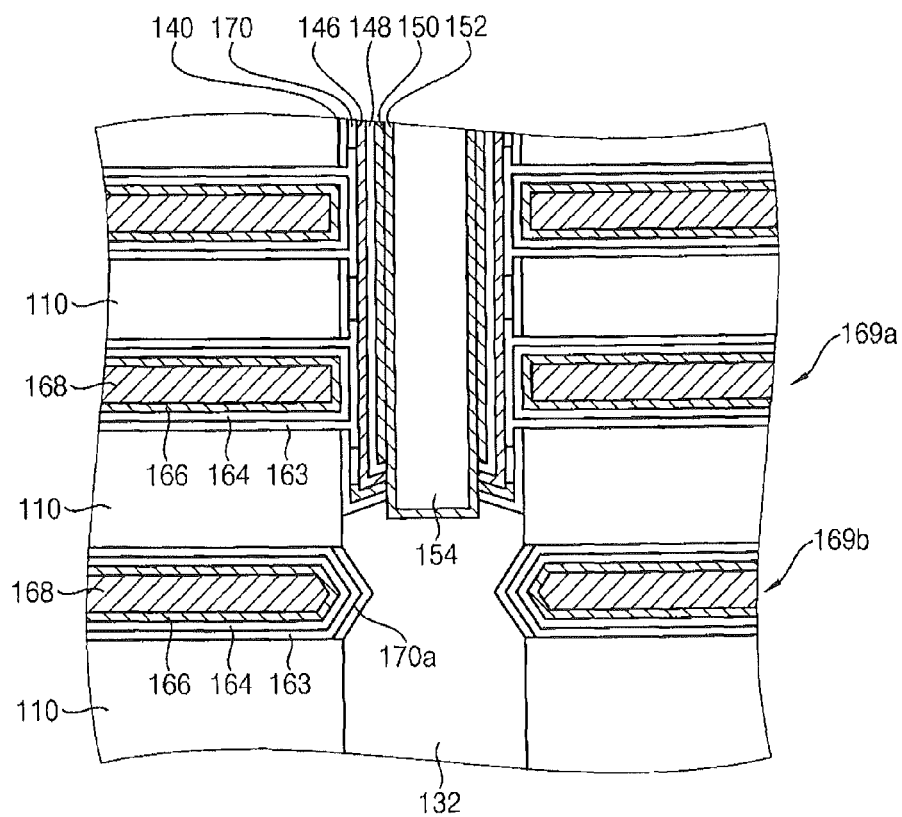

FIGS. 9A and 9B are cross-sectional views illustrating methods of forming the vertical type semiconductor device illustrated in FIG. 7A.

FIGS. 9A and 9B are enlarged cross-sectional views on section A in FIG. 7A.

The structure illustrated in FIG. 4C may be formed by conducting the same procedure explained referring to FIGS. 4A to 4C. Then, the same processes explained referring to FIGS. 6A to 6C may be conducted to form the structure illustrated in FIG. 6C. That is, the first blocking dielectric layer may be omitted from the structure in FIG. 6C.

Hereinafter, an oxidation target layer may be explained as a first polysilicon layer, and an oxidation target layer pattern may be explained as a first polysilicon layer pattern. However, the oxidation target layer and the oxidation target layer pattern may be formed by using silicon nitride.

Referring to FIG. 9A, a wet etching process for selectively and slowly etching the first polysilicon layer 142 may be conducted to remove the first polysilicon layer 142 exposed at the gap portion. In addition, a portion of the first polysilicon layer 142 making contact with the first insulating interlayer 110 may be removed. Thus, a first polysilicon pattern having a smaller height than the first insulating interlayer in each layer may be formed.

An oxidation process may be conducted to oxidize the whole first polysilicon pattern to form a second silicon oxide layer pattern 170. The oxidation process may include a radical oxidation process or a plasma oxidation process. In the oxidation process, the semiconductor pattern 132 may be oxidized together to form a silicon oxide layer pattern 170a on the exposed surface of the semiconductor pattern 132.

Then, a first blocking dielectric layer 163 may be formed along the profile of the first insulating interlayer 110, the first silicon oxide layer 140 and the second silicon oxide layer pattern 170 in the gap. The first blocking dielectric layer 163 may be formed by depositing silicon oxide by a chemical vapor deposition method.

Referring to FIG. 9B, a second blocking dielectric layer 164 may be formed on the first blocking dielectric layer 163. Then, a barrier metal layer 166 may be formed on the second blocking dielectric layer 164, and a metal layer 168 completely filling up the gap portion may be formed.

Then, the metal layer 168 and the barrier metal layer 166 formed in the opening portion 160 may be removed to form first and second word line structures 169a and 169b respectively in the gaps 122a and 122b. The removing process may include a wet etching process.

Through conducting the above-described processes, the vertical type semiconductor device illustrated in FIG. 7A may be manufactured.

In this example embodiment, by forming an oxide having an insulating property by oxidizing the surface of the oxidation target layer, the oxidation target layer and other conductive patterns may be insulated from each other. Particularly, when polysilicon is used as the oxidation target layer, since the polysilicon may have a high etching selectivity with respect to an etching solution for removing the sacrificial layer, the consumption of the first insulating interlayer may be decreased.

Figure 10B:
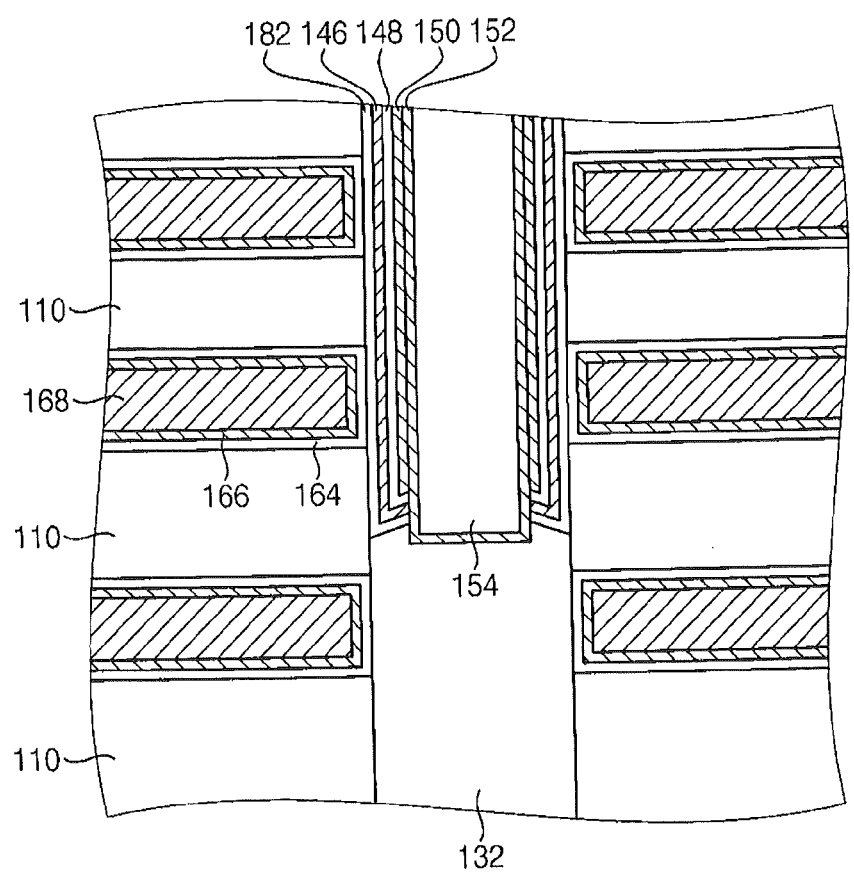
FIG. 10B is an enlarged cross-sectional view on section A in FIG. 10A.

FIG. 10A is a cross-sectional view of a vertical type semiconductor device in accordance with Example Embodiment 3. FIG. 10B is an enlarged cross-sectional view on section A in FIG. 10A.

In FIG. 10A, channel patterns 150 and 152, a tunnel insulating layer 148 and a charge storing layer 146 may be illustrated as one layer 149a. However, the layers may have the same stacked structure as illustrated in FIG. 10B.

Referring to FIGS. 10A and 10B, a vertical memory device may include channel patterns 150 and 152 having a cylindrical shape and extruded and extended in the first direction, and a pillar structure 158 including channel patterns 150 and 152 having a cylinder shape and extruded and extended in the first direction, a first burying insulating layer pattern 154 filling up the inner space of each of the channel patterns 150 and 152, and a tunnel insulating layer 148, a charge storing layer 146 and a thermal oxidation layer 182 stacked one by one so as to surround the outer wall of each of the channel patterns 150 and 152, on a substrate 100.

First and second word line structures 169a and 169b surrounding the side wall of the pillar structure 158 and extended in the third direction may be provided. At one pillar structure 158, the first and second word line structures 169a and 169b having a stacked structure with a distance in the first direction may be provided. Between the vertically separated space of the first and second word line structures 169a and 169b, first insulating interlayers 110 may be provided. In addition, the vertical type memory device may further include a common source line (CSL) 178 and a bit line (not illustrated).

The substrate 100 may include a semiconductor material such as silicon and germanium.

A semiconductor pattern 132, channel patterns 150 and 152, a charge storing layer 146 and a tunnel insulating layer 148 may have the same structure and disposition as explained referring to FIGS. 1 and 2. In addition, as explained in FIG. 1, a pad 156 may be provided on the pillar structure.

A thermal oxidation layer 182 provided on the charge storing layer 146 may be provided as a first blocking dielectric layer. The thermal oxidation layer 182 may be an oxide formed by thermally oxidizing polysilicon or silicon nitride. The thermal oxidation layer 182 may be silicon oxide or a SiOC material.

The first word line structures 190a may be disposed while facing the channel patterns 150 and 152 portions. The first word line structures 190a may have a shape for filling up a gap portion formed between the first insulating interlayers 110 in each layer in the first direction.

The first word line structures 190a may include a second blocking dielectric layer 164, a barrier metal layer 166 and a metal layer 168 and may have a stacked structure thereof. The second blocking dielectric layer 164 may make contact with the thermal oxidation layer 182. Alternatively, silicon oxide may be additionally inserted between the second blocking dielectric layer 164 and the thermal oxidation layer 182.

The second word line structures 190b may be disposed while facing the semiconductor pattern 132 portion. The second word line structures 190b may include the second blocking dielectric layer 164, a barrier metal layer 166 and a metal layer 168, and may have a stacked structure thereof. The second blocking dielectric layer 164 may make contact with the semiconductor pattern 132. Alternatively, silicon oxide may be inserted between the second blocking dielectric layer 164 and the semiconductor pattern 132.

The thermal oxidation layer 182 may have a higher etching selectivity with respect to silicon nitride provided as sacrificial layers when comparing with a silicon oxide layer formed by a chemical vapor deposition layer. That is, the thermal oxidation layer 182 may be etched very slowly or may be hardly etched during conducting the etching process of silicon nitride. Thus, the thermal oxidation layer 182 may not be removed ununiformly by the etching process, the thermal oxidation layer 182 may remain to a uniform thickness after conducting the etching process. Thus, processes of removing the thermal oxidation layer 182 and re-depositing the silicon oxide layer uniformly may not be necessary. In addition, the thermal oxidation layer 182 may be used as a first blocking dielectric layer.

FIGS. 11A to 11D are cross-sectional views illustrating methods of forming the vertical type semiconductor device in FIGS. 10A and 10B.

FIGS. 11A to 11D are enlarged views on section A in FIG. 10A.

First, the structure illustrated in FIG. 4C may be formed by conducting the same procedure explained referring to FIGS. 4A to 4C.

Figure 11A:
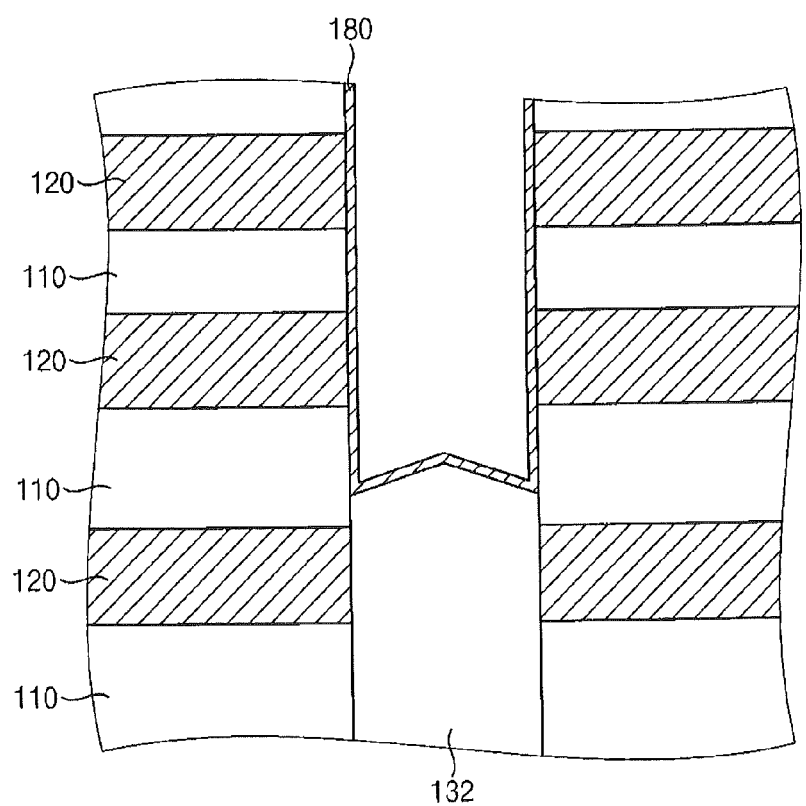
FIGS. 11A to 11D are cross-sectional views illustrating methods of forming the vertical type semiconductor device in FIGS. 10A and 10B.

Referring to FIG. 11A, a semiconductor pattern 132 partially filling up the lower portion of each of the channel holes 130 may be formed. On the side wall of the channel hole 130 and on the upper surface of the first semiconductor pattern 132 and on a hard mask, a first polysilicon layer 180 may be formed. The first polysilicon layer 180 may be provided as an oxidation target layer for forming a thermal oxidation layer through an oxidation process in a following process. In this example embodiment, polysilicon was used as the oxidation target layer. However, silicon nitride may be used as the oxidation target layer instead of polysilicon. When silicon nitride was used as the oxidation target layer, the same subsequent procedure may be conducted. The final vertical type semiconductor device may be the same as the structure illustrated in FIG. 10A.

Figure 11B:
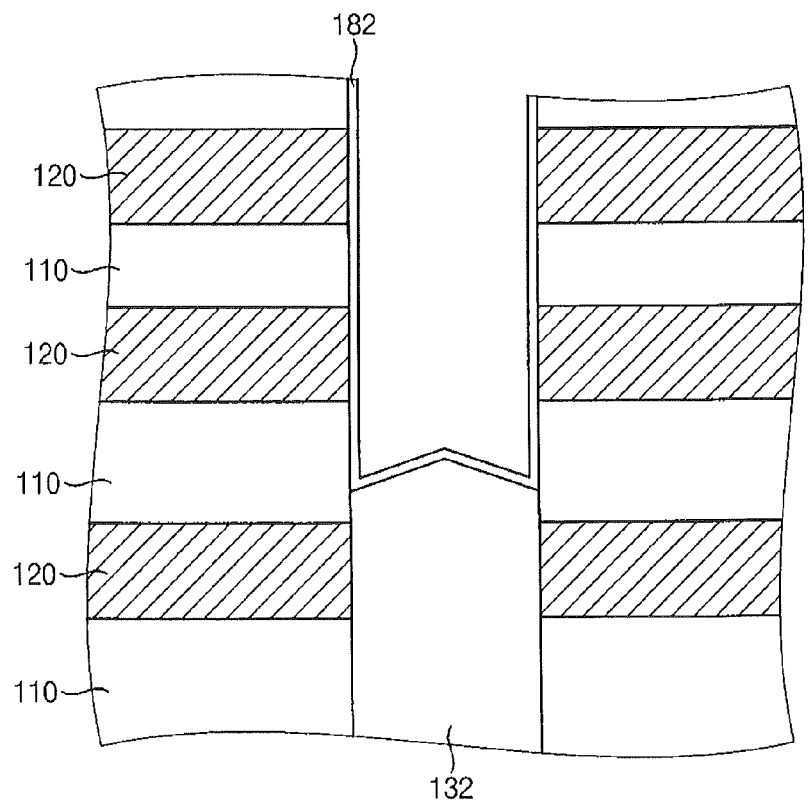

Referring to FIG. 11B, the whole first polysilicon layer 180 may be oxidized to form a thermal oxidation layer 182. The thermal oxidation layer 182 may be silicon oxide or SiOC.

Figure 11C:
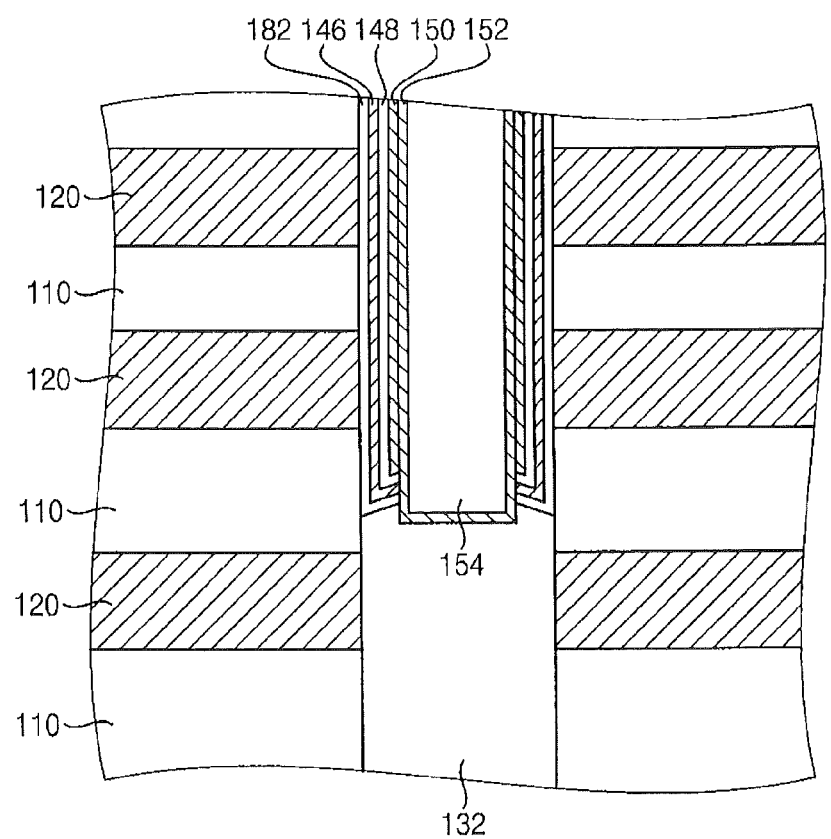

Referring to FIG. 11C, a charge storing layer 146, a tunnel insulating layer 148 and a second polysilicon layer 150 may be formed one by one on the thermal oxidation layer 182.

Then, the upper portion of the semiconductor pattern 132 may be exposed by etching the second polysilicon layer 150, the tunnel insulating layer 148, the charge storing layer 146 and the thermal oxidation layer 182. On the surface of the second polysilicon layer 150 and the semiconductor pattern 132, a third polysilicon layer 152 may be formed. In addition, a first burying insulating layer pattern 154 filling up the channel holes 130 may be formed.

A portion of the upper portion of the first burying insulating layer pattern 154 may be removed to form openings. In the openings, a polysilicon layer may be formed and polished to form a pad 156 (see FIG. 10A).

Figure 11D:
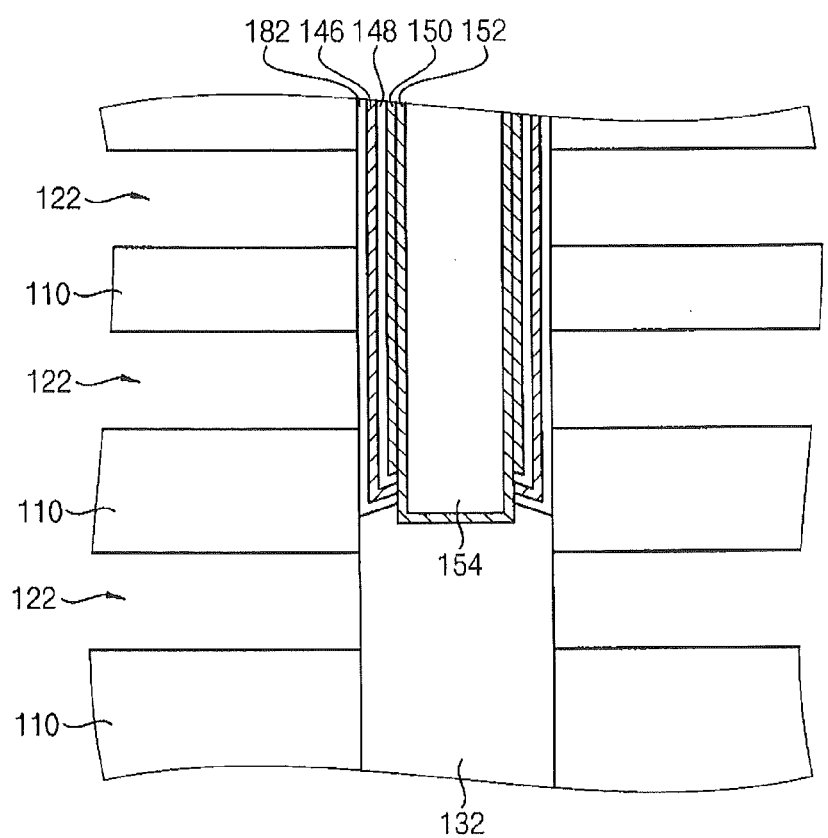

Referring to FIG. 11D, openings 160 (see FIG. 10A) penetrating the first insulating interlayers 110 and the sacrificial layers 120 may be formed to expose the upper surface of the substrate 100. The openings 160 may be formed to define the gap portion between the word line structures. The openings 160 may be formed so as to be extended in the third direction.

Through removing the sacrificial layers 120 exposed to the side wall of the openings 160 in each layer, a gap 122 between the first insulating interlayers 110 may be formed. A portion of the side wall of the thermal oxidation layer and the semiconductor pattern 132 may be exposed by the gap 122.

The removing process of the sacrificial layers 120 may be conducted by a wet etching process using an etching solution having a high etching selectivity with respect to the first insulating interlayer 110. The etching solution may include phosphoric acid.

As explained in FIG. 4F, the contacting time period of the sacrificial layer and the etching solution may be different according to the position of the sacrificial layer 120 during the etching process. Thus, the contacting time of the thermal oxidation layer 182 and the etching solution may be different according to the position of the thermal oxidation layer 182.

However, the thermal oxidation layer 182 may have a higher etching selectivity with respect to the sacrificial layer when comparing with silicon oxide formed by a chemical vapor deposition method. Thus, the thermal oxidation layer 182 may be hardly etched by the etching solution. After conducting the removing process of the sacrificial layer, the thickness of the thermal oxidation layer 182 included in the pillar structure of the first to fourth rows may be very uniform. Accordingly, the thermal oxidation layer 182 may be used as a first blocking dielectric layer. That is, the removing of the thermal oxidation layer 182 and re-depositing of the first blocking dielectric layer may be omitted.

Referring to FIG. 10B again, a second blocking dielectric layer 164 may be formed along the surface of the gap 122 portion on the thermal oxidation layer 182. Then, a barrier metal layer 166 may be formed on the second blocking dielectric layer 164, and a metal layer 168 for completely filling up the gap 122 portion may be formed.

Then, first and second word line structures 190a and 190b may be formed in the gap 122 by removing the metal layer 168 and the barrier metal layer 166 formed in the opening 160. The removing process may include a wet etching process.

Through conducting the above-described process, the vertical type semiconductor device having the structure illustrated in FIG. 10A may be manufactured.

In this example embodiment, since the etching process of the polysilicon layer is omitted, the side wall of the semiconductor pattern 132 may not be etched. Accordingly, the side wall of the second word line structure 169a making contact with the semiconductor pattern 132 may have a vertical slope.

In this example embodiment, a thermal oxidation layer formed by using silicon oxide or SiOC may be used as an etch stopping layer while removing the sacrificial layer. Thus, in the removing process of the sacrificial layer, the consumption of the first insulating interlayers may be decreased. Thus, the integration degree of the vertical type semiconductor device may be increased.

Figure 12:
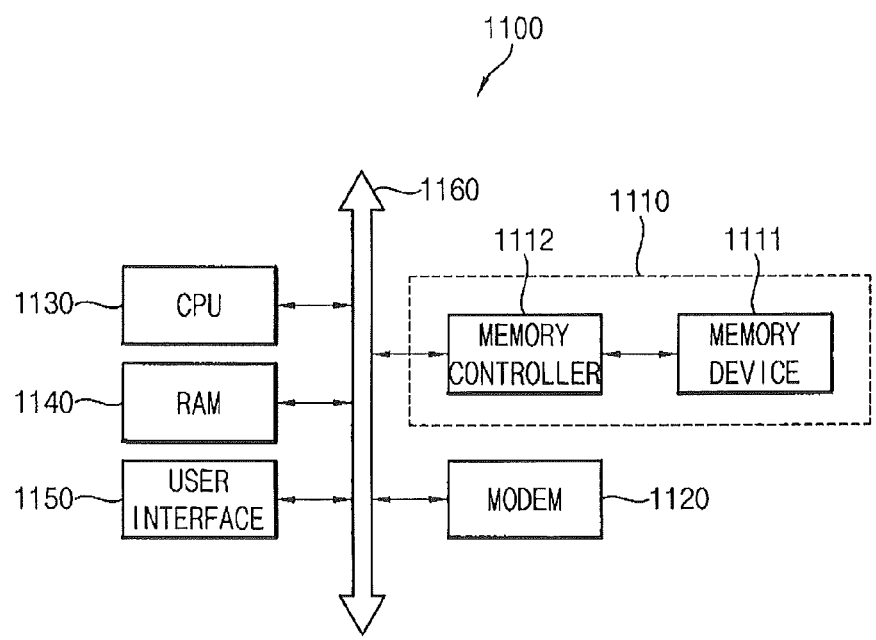
FIG. 12 is a block diagram illustrating an information processing system in accordance with some embodiments of the present inventive concept.

FIG. 12 is a block diagram illustrating an information processing system in accordance with an example embodiment.

Referring to FIG. 12, an information processing system 1100 may include a vertical type nonvolatile memory device 1111 in accordance with exemplary embodiments.

The information processing system 1100 may include a memory system 1110, and a modem 1120, a central processing unit 1130, a ram 1140 and a user interface 1150 electrically connected to a system bus 1160, respectively. In the memory system 1110, data processed by the central processing unit 1130 and data input from outside the system 1100 may be stored. The vertical type nonvolatile memory device 1111 in accordance with an example embodiment may be included in the memory system 1110, and data may be stably stored by the information processing system 1100.

The information processing system 1100 may be further provided with an application chipset, a camera image processor (CIS), a mobile DRAM, an input/output apparatus, etc.

As described above, the consumption of the insulating interlayer may be restrained in the removal process of the sacrificial layer according to exemplary embodiments. Thus, the height of the insulating interlayer of each layer may be decreased to provide a more highly integrated vertical type semiconductor device. The vertical type semiconductor device may be applied in diverse electronic products and telecommunication products.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed:

1. A vertical type semiconductor device comprising:
   a pillar structure including a semiconductor pattern and a channel pattern protruding in a first direction, the first direction being a vertical direction relative to an upper surface of a substrate;
   first word line structures horizontally extending to surround the pillar structure at a facing portion relative to the channel pattern, the first word line structures including a blocking dielectric layer pattern and a metal pattern, a height of the first word line structures being enlarged at a portion making contact with the pillar structure; and
   a first insulating structure surrounding the pillar structure between the first word line structures in the first direction, the first insulating structure including a first portion having a relatively smaller height and making contact with the pillar structure and a second portion horizontally extended to a side direction of the first portion.

2. The semiconductor device of claim 1, wherein the first portion of the first insulating structure includes a polysilicon covered with an oxide, or includes a silicon nitride covered with an oxide.

3. The semiconductor device of claim 1, wherein the first portion of the first insulating structure includes a thermal oxidation layer pattern.

4. The semiconductor device of claim 1, wherein the second portion of the first insulating structure includes silicon oxide formed using chemical vapor deposition.

5. The semiconductor device of claim 1, further comprising a second word line structure surrounding the pillar structure at a portion facing the semiconductor pattern.

6. The semiconductor device of claim 5, wherein the semiconductor pattern includes a groove shaped side wall portion making contact with the second word line structure, and the second word line structure includes a protruding shape that contacts the groove shaped side wall of the semiconductor pattern.

7. The semiconductor device of claim 1, wherein the pillar structure includes layers of a first blocking dielectric layer including a tunnel insulating layer, a charge storing layer and silicon oxide layer surrounding an outer wall of the channel pattern.

8. The semiconductor device of claim 1, wherein the pillar structure includes a tunnel insulating layer and a charge storing layer stacked one by one to surround an outer wall of the channel pattern.

9. The semiconductor device of claim 1, wherein a blocking dielectric layer included in the first word line structure includes a metal oxide.

10. A vertical type semiconductor device comprising:
   a vertical pillar structure including a channel pattern with an outer wall;
   horizontal insulating structures vertically spaced apart from one another along the vertical pillar structure to define first vertical gaps therebetween at first locations away from the outer wall and second vertical gaps therebetween at the outer wall, the second vertical gaps being wider than the first vertical gaps; and
   horizontal wordline structures conformally located in the first and second vertical gaps between the vertically spaced apart horizontal insulating structures, the horizontal wordline structures being vertically thinner across the first vertical gaps than across the second vertical gaps.

11. The device of claim 10 wherein the horizontal insulating structures further comprise:
   respective oxidation target layers on the outer wall of the channel pattern providing upper and lower vertical boundaries of the second vertical gaps.

12. The device of claim 11 wherein the respective oxidation target layers further comprise a layer including oxidized upper and lower portions providing the upper and lower vertical boundaries, respectively.

13. The device of claim 12 wherein the layer comprises a polysilicon layer and the oxidized upper and lower portions each comprise respective upper and lower silicon oxide portions of the polysilicon layer.

14. The device of claim 10 wherein upper and lower vertical boundaries of the second vertical gaps are recessed relative to upper and lower vertical boundaries of the horizontal insulating structures at the first locations.

15. The device of claim 10 wherein the horizontal insulating structures further comprise:
   respective silicon nitride layers on the outer wall of the channel pattern providing upper and lower vertical boundaries of the second vertical gaps.

16. The device of claim 10 wherein the outer wall comprises a first blocking dielectric layer contacting the horizontal insulating structures and the horizontal wordline structures.

17. The device of claim 16 wherein the horizontal wordline structures each comprise a metal pattern and a second blocking dielectric layer between the first blocking dielectric layer and the metal pattern.

18. The device of claim 10 wherein the vertical pillar structure further comprises a groove in an outer surface thereof below a lower boundary of the channel pattern.

19. The device of claim 18 wherein the horizontal wordline structures comprise first horizontal wordline structures, the device further comprising:
   at least one second horizontal wordline structure vertically spaced apart from the first horizontal wordline structures, and conformally protruding into the groove in the outer surface of the vertical pillar structure.

* * * * *